(12) United States Patent
Tanaka et al.

(10) Patent No.: US 12,109,648 B2
(45) Date of Patent: Oct. 8, 2024

(54) LASER ANNEALING APPARATUS AND METHOD FOR MANUFACTURING ELECTRONIC DEVICE

(71) Applicant: Gigaphoton Inc., Tochigi (JP)

(72) Inventors: Satoshi Tanaka, Oyama (JP); Akiyoshi Suzuki, Oyama (JP); Hideo Hoshino, Oyama (JP)

(73) Assignee: Gigaphoton Inc., Tochigi (JP)

( * ) Notice: Subject to any disclaimer, the term of this patent is extended or adjusted under 35 U.S.C. 154(b) by 600 days.

(21) Appl. No.: 17/487,348

(22) Filed: Sep. 28, 2021

(65) Prior Publication Data
US 2022/0009031 A1    Jan. 13, 2022

Related U.S. Application Data

(63) Continuation of application No. PCT/JP2019/021751, filed on May 31, 2019.

(51) Int. Cl.
*B23K 26/082* (2014.01)
*B23K 26/0622* (2014.01)
*B23K 101/40* (2006.01)

(52) U.S. Cl.
CPC ........ *B23K 26/082* (2015.10); *B23K 26/0622* (2015.10); *B23K 2101/40* (2018.08)

(58) Field of Classification Search
CPC .............. B23K 26/082; B23K 26/0622; B23K 2101/40; B23K 26/00; B23K 37/0408;
(Continued)

(56) References Cited

U.S. PATENT DOCUMENTS

| 2006/0141683 A1 | 6/2006 | Noue et al. |
| 2008/0227274 A1 | 9/2008 | Hongo et al. |

(Continued)

FOREIGN PATENT DOCUMENTS

| JP | 2004-342875 A | 12/2004 |
| JP | 2005-072181 A | 3/2005 |

(Continued)

OTHER PUBLICATIONS

International Search Report issued in PCT/JP2019/021751; mailed Jul. 16, 2019.

(Continued)

*Primary Examiner* — Phuong T Nguyen
(74) *Attorney, Agent, or Firm* — Studebaker & Brackett PC

(57) ABSTRACT

Provided is a laser annealing apparatus causing laser light to be radiated to processing receiving areas arranged, out of a first direction and a second direction perpendicular to the first direction, along at least the second direction and move a batch radiation area and a workpiece in the first direction, and the laser annealing apparatus includes an energy density measuring apparatus measuring the energy density at, out of first and second ends of the batch radiation area in the second direction, at least the second end, an energy density adjusting apparatus adjusting the energy density at the first end, and a controller controlling the energy density adjusting apparatus. The energy density at the first end when (N+1)-th scanning is performed is so adjusted that the energy density at the first end in an (N+1)-th scan area approaches the energy density at the second end in the N-th scan area.

20 Claims, 33 Drawing Sheets

(58) Field of Classification Search
CPC .. B23K 26/354; B23K 26/70; B23K 26/0643; B23K 26/0066; B23K 26/127; B23K 26/352
USPC .............. 219/121.82, 121.6, 121.65, 121.66, 219/121.75, 121.77, 121.78, 121.86
See application file for complete search history.

(56) References Cited

U.S. PATENT DOCUMENTS

| | | |
|---|---|---|
| 2019/0287790 A1 | 9/2019 | Mizumura et al. |
| 2020/0027722 A1 | 1/2020 | Nakagawa |

FOREIGN PATENT DOCUMENTS

| | | | |
|---|---|---|---|
| JP | 2008-218862 A | 9/2008 | |
| JP | 2011-187760 A | 9/2011 | |
| JP | 2013-054315 A | 3/2013 | |
| JP | 2017-151259 A | 8/2017 | |
| JP | 2018-093154 A | 6/2018 | |
| WO | 2008/120785 A1 | 10/2008 | |
| WO | 2018/138783 A1 | 8/2018 | |

OTHER PUBLICATIONS

International Preliminary Report on Patentability and Written Opinion issued in PCT/JP2019/021751; issued Nov. 16, 2021.

LASER ANNEALING APPARATUS AND METHOD FOR MANUFACTURING ELECTRONIC DEVICE

CROSS-REFERENCE TO RELATED APPLICATIONS

The present application is a continuation application of International Application No. PCT/JP2019/021751, filed on May 31, 2019, the entire contents of which are hereby incorporated by reference.

BACKGROUND

1. Technical Field

The present disclosure relates to a laser annealing apparatus and a method for manufacturing an electronic device.

2. Related Art

Thin film transistors (TFTs) are used as devices that drive a flat panel display using a glass substrate. To achieve a high-definition display, it is necessary to produce high driving power TFTs. A semiconductor thin film that forms the channel of a TFT is made, for example, of polycrystalline silicon or indium gallium zinc oxide (IGZO). Polycrystalline silicon and IGZO have higher carrier mobility and more excellent transistor on/off characteristics than amorphous silicon.

Semiconductor thin films are also expected to be used in 3D ICs that achieve devices having more advanced functions. A 3D IC is achieved by forming active elements, such as a sensor, an amplification circuit, and a CMOS circuit, in the top layer of an integrated circuit device. To this end, a technology for manufacturing higher quality semiconductor thin films is required.

Furthermore, diversification of information terminal instruments is creating a growing demand for flexible displays and computers that are compact and lightweight, consume a small amount electric power, and can be freely folded. It is therefore required to establish a technology for forming a high-quality semiconductor thin film on a plastic substrate made, for example, of polyethylene terephthalate (PET).

To form a high-quality semiconductor thin film on a glass substrate, an integrated circuit, or a plastic substrate, it is necessary to crystallize the semiconductor thin film without thermal damage to the substrate. A process temperature of 400° C. or lower is required for glass substrates used to form displays, 400° C. or lower for integrated circuits, and 200° C. or lower for PET used to form plastic substrates.

Laser annealing is used as a technology for crystallizing a semiconductor thin film without thermal damage to the substrate under the semiconductor thin film. In the laser annealing, pulsed ultraviolet laser light absorbed by an upper-layer semiconductor thin film is used to suppress damage to the substrate due to thermal diffusion.

When the semiconductor thin film is made of silicon, an XeF excimer laser, which emits light having a wavelength of 351 nm, an XeCl excimer laser, which emits light having a wavelength of 308 nm, a KrF excimer laser, which emits light having a wavelength of 248 nm, or any other suitable laser is used. The ultraviolet gas lasers described above are characterized in that they emit laser light having lower laser light interference, provide excellent energy uniformity at the laser light irradiated surface, and allow uniform annealing of a large area with high pulse energy, as compared with solid-state lasers.

CITATION LIST

Patent Literature

[PTL 1] WO 2008/120785
[PTL 2] JP-A-2013-54315
[PTL 3] JP-A-2017-151259

SUMMARY

A laser annealing apparatus according to a viewpoint of the present disclosure includes a laser apparatus configured to output laser light, an optical system configured to cause the laser light to be radiated in a form of batch radiation to a plurality of processing receiving areas arranged, out of a first direction and a second direction perpendicular to the first direction in a plane of a workpiece, along at least the second direction, a relative movement apparatus configured to move the workpiece and a batch radiation area relative to each other in the first direction and the second direction, the batch radiation area having an array of a plurality of radiation areas via which the laser light is radiated and which correspond to an array of the plurality of processing receiving areas on which the batch radiation is performed, a controller configured to control the laser apparatus and the relative movement apparatus in such a way that the batch radiation area and the workpiece are moved relative to each other, which is called scanning, in the first direction in an N-th scan area of the workpiece in N-th scanning, where N is an integer greater than or equal to one, so that the processing receiving areas arranged in a grid along the first and second directions in the N-th scan area are each irradiated with the laser light, after the N-th scanning, the batch radiation area and the workpiece are moved relative to each other in the second direction so that an area to undergo the scanning is changed to an (N+1)-th scan area, and the scanning is performed during (N+1)-th scanning on the (N+1)-th scan area of the workpiece, which is adjacent to and does not overlap with the N-th scan area, an energy density measuring apparatus configured to measure an energy density at, out of a first end and a second end that are opposite ends of the batch radiation area in the second direction, at least the second end, and an energy density adjusting apparatus configured to adjust the energy density at least at the first end out of the first end and the second end of the batch radiation area, the controller being configured to control the energy density adjusting apparatus based on a result of the measurement made by the energy density measuring apparatus to adjust the energy density at the first end when the (N+1)-th scanning is performed in such a way that the energy density at the first end in the (N+1)-th scan area adjacent to the second end in the N-th scan area approaches the energy density at the second end in the N-th scan area.

A method for manufacturing an electronic device according to another viewpoint of the present disclosure by using a laser annealing apparatus including a laser apparatus configured to output laser light, an optical system configured to cause the laser light to be radiated in a form of batch radiation to a plurality of processing receiving areas arranged, out of a first direction and a second direction perpendicular to the first direction in a plane of a workpiece, along at least the second direction, a relative movement apparatus configured to move the workpiece and a batch radiation area relative to each other in the first direction and the second direction, the batch radiation area having an array of a plurality of radiation areas via which the laser light is radiated and which correspond to an array of the plurality of processing receiving areas on which the batch radiation is performed, a controller configured to control the laser apparatus and the relative movement apparatus in such a way that the batch radiation area and the workpiece are moved relative to each other, which is called scanning, in the first direction in an N-th scan area of the workpiece in N-th scanning, where N is an integer greater than or equal to one, so that the processing receiving areas arranged in a grid along the first and second directions in the N-th scan area are each irradiated with the laser light, after the N-th scanning, the batch radiation area and the workpiece are moved relative to each other in the second direction so that an area to undergo the scanning is changed to an (N+1)-th scan area, and the scanning is performed during (N+1)-th scanning on the (N+1)-th scan area of the workpiece, which is adjacent to and does not overlap with the N-th scan area, an energy density measuring apparatus configured to measure an energy density at, out of a first end and a second end that are opposite ends of the batch radiation area in the second direction, at least the second end, and an energy density adjusting apparatus configured to adjust the energy density at least at the first end out of the first end and the second end of the batch radiation area, the controller being configured to control the energy density adjusting apparatus based on a result of the measurement made by the energy density measuring apparatus to adjust the energy density at the first end when the (N+1)-th scanning is performed in such a way that the energy density at the first end in the (N+1)-th scan area adjacent to the second end in the N-th scan area approaches the energy density at the second end in the N-th scan area, the method including performing the scanning a plurality of times including the N-th scanning and the (N+1)-th scanning on the workpiece to anneal each of the processing receiving areas of the workpiece.

BRIEF DESCRIPTION OF THE DRAWINGS

Embodiments of the present disclosure will be described below only by way of example with reference to the accompanying drawings.

DETAILED DESCRIPTION

Contents

Figure 1:
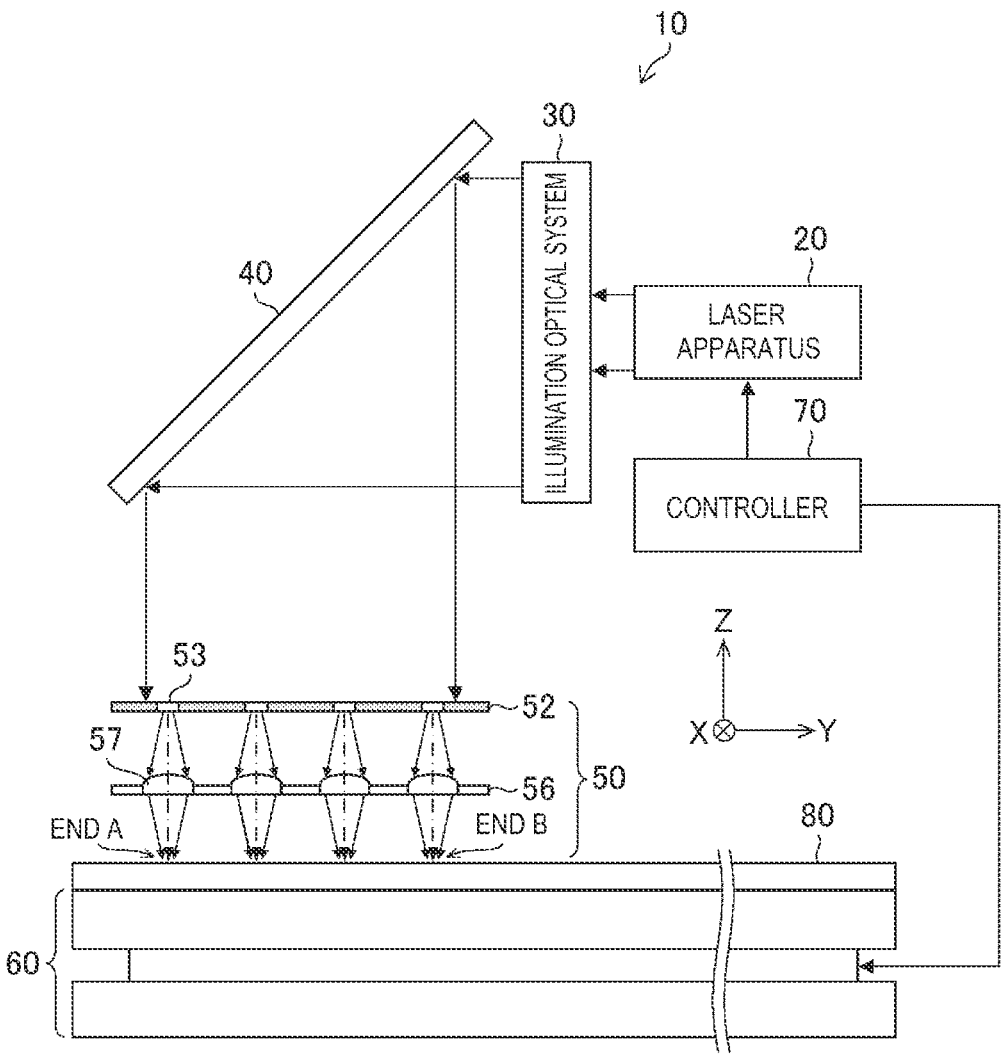
FIG. 1 schematically shows the configuration of an exemplary laser annealing apparatus.

1. Overall description of laser annealing apparatus
1.1 Configuration
1.2 Operation
2. Problems
3. First Embodiment
3.1 Configuration
3.2 Operation
3.3 Effects and advantages
3.4 First variation
3.4.1 Configuration
3.4.2 Operation
3.4.3 Effects and advantages
3.5 Second variation
3.5.1 Configuration
3.5.2 Operation
3.5.3 Effects and advantages
4. Second Embodiment
4.1 Configuration
4.2 Operation
4.3 Effects and advantages
4.4 First variation
4.4.1 Configuration
4.4.2 Operation
4.4.3 Effects and advantages
4.5 Second Variation
4.5.1 Configuration
4.5.2 Operation
4.5.3 Effects and advantages
4.6 Third variation
4.6.1 Configuration
4.6.2 Operation
4.6.3 Effects and advantages
4.6.4. Others
4.7 Fourth variation
4.7.1 Configuration
4.7.2 Operation
4.7.3 Effects and advantages
5. Examples of other forms for measuring energy density of pulsed laser light
6. Arrangement of plurality of radiation areas in batch radiation area
7. Method for manufacturing electronic device
8. Others Embodiments of the present disclosure will be described below in detail with reference to the drawings. The embodiments described below show some examples of the present disclosure and are not intended to limit the contents of the present disclosure. Furthermore, all configurations and operations described in the embodiments are not necessarily essential as configurations and operations in the present disclosure. The same component has the same reference character, and no redundant description of the same component will be made.

1. Overall Description of Laser Annealing Apparatus

1.1 Configuration

FIG. 1 schematically shows the configuration of an exemplary laser annealing apparatus. A laser annealing apparatus 10 is an apparatus that radiates pulsed laser light having an ultraviolet wavelength, such as an excimer laser, onto an amorphous (non-crystalline) silicon film deposited on a glass substrate to modify the amorphous silicon into polysilicon. For example, a TFT can be formed by modifying amorphous silicon into polysilicon. TFTs are used in a relatively large LCD display.

The laser annealing apparatus 10 includes a laser apparatus 20, an illumination optical system 30, a high-reflection mirror 40, a multipoint processing optical system 50, a stage 60, and a controller 70. A substrate 80 placed on the stage 60 is a workpiece to be annealed. The substrate 80 is a glass substrate coated with amorphous silicon. The substrate 80 is called a workpiece in some cases.

The laser apparatus 20 outputs pulsed laser light having an ultraviolet wavelength that allows annealing of amorphous silicon. For example, the laser apparatus 20 is a discharge-excitation-type excimer laser apparatus containing $F_2$, ArF, KrF, XeCl, or XeF as the laser medium.

The illumination optical system 30 shapes the pulsed laser light to uniformly illuminate a mask 52, and guides the shaped pulsed laser light to the high-reflection mirror 40. The illumination optical system 30 includes, for example, a fly-eye lens and a condenser optical system, which are not shown, for uniform illumination on the mask 52. The condenser optical system may be a combination of a convex lens and a concave lens.

The high-reflection mirror 40 is configured to guide the pulsed laser light shaped by the illumination optical system 30 onto the mask 52.

The multipoint processing optical system 50 includes the mask 52 and a microlens array 56 that projects a mask pattern onto the substrate 80 in such a way that the size of the projected mask pattern is reduced. The action of the microlens array 56 is not limited to the reduced projection and may instead be equal projection.

The mask 52 has a plurality of mask pattern openings 53, and the shape of each of the openings is similar to the shape of an annealing target area on the substrate 80. The annealing target area is the area where the amorphous silicon on the substrate 80 is converted into polysilicon. A large number of annealing target areas are arranged in a grid pattern on the surface of the substrate 80 at fixed intervals in directions X and Y in FIG. 1. The shape, number, and arrangement of the annealing target areas can be designed as appropriate.

The mask pattern openings 53 are portions that form light passage areas of the mask 52. The plurality of mask pattern openings 53 are arranged at equal intervals in the direction Y in FIG. 1 in correspondence with the arrangement of the annealing target areas on the substrate 80. The arrangement of the mask pattern openings 53 in the mask 52 may have only one row or a plurality of rows each formed of a plurality of mask pattern openings 53 arranged in the direction Y. The number of rows typically ranges from several tens to several hundreds in consideration of the productivity and feasibility of the laser annealing apparatus 10. The overall arrangement pattern of the plurality of mask pattern openings 53 formed in the mask 52 is called a mask pattern.

Lenses 57 of the microlens array 56 are disposed in correspondence with the positions of the respective mask pattern openings 53.

The stage 60 is a motorized stage configured to be capable of moving the substrate 80, which is the annealing target, in the directions X and Y shown in FIG. 1. The stage 60 may further have the function of adjusting the substrate 80 in a direction Z. The directions X and Y are parallel to the surface of the substrate 80, and the direction Y is perpendicular to the direction X. The direction Z is perpendicular to the surface of the substrate 80.

The controller 70 is connected to the laser apparatus 20 and the stage 60 and controls the output of the pulsed laser light and the operation of driving the stage 60 in the directions X and Y in synchronization with each other. The controller 70 may also set the repetition frequency and the energy of the pulsed laser light and adjust the position of the stage 60 in the direction Z.

1.2 Operation

The controller 70 accesses the laser apparatus 20 and sets the repetition frequency and pulse energy of the pulsed laser light. The controller 70 further moves the stage 60 to an annealing start position.

When the controller 70 instructs the laser apparatus 20 to output the laser light, the laser apparatus 20 outputs the pulsed laser light having the set repetition frequency and pulse energy. The pulsed laser light outputted from the laser apparatus 20 is shaped by the illumination optical system 30 into pulsed laser light having a roughly rectangular cross-sectional profile elongated in the direction Y on the mask 52.

Figure 2:
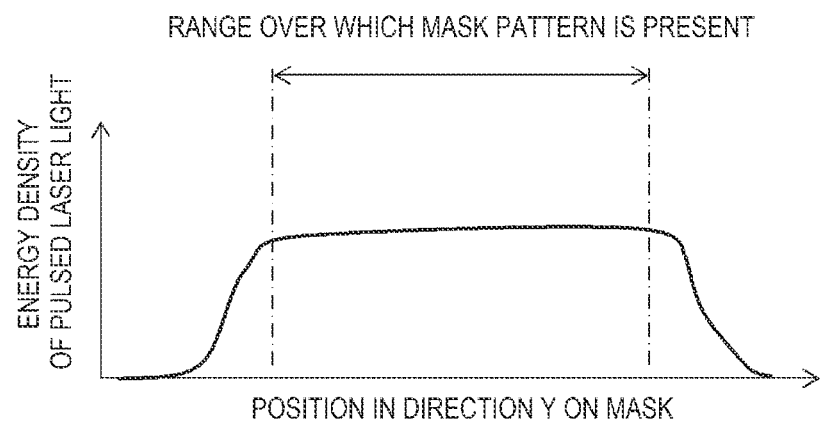
FIG. 2 is a graph showing an on-mask energy density distribution of pulsed laser light with which the mask is illuminated.

FIG. 2 is a graph showing an energy density distribution, on the mask 52, of the pulsed laser light with which the mask 52 is illuminated. The pulsed laser light is homogenized so that a roughly uniform energy density distribution is achieved on the mask 52 in the area where the mask pattern is present, as shown in FIG. 2.

The pulsed laser light having been shaped and homogenized by the illumination optical system 30 passes through the mask pattern openings 53 in the mask 52. In this process, the pulsed laser light is shaped so as to be similar to the shape of each area where the amorphous silicon on the substrate 80 is converted into polysilicon.

The pulsed laser light having passed through the mask pattern openings 53 in the mask 52 is radiated at a predetermined energy density by the microlens array 56 onto predetermined areas of the substrate 80 to anneal the portions in the irradiated areas. In the areas of the substrate 80 that are irradiated with the pulsed laser light, the amorphous silicon melts and becomes polycrystalline, forming polysilicon.

The controller 70 stops the laser output after the number of laser radiation actions or the laser radiation period that causes the annealing target areas to be sufficiently annealed is reached or elapses.

The controller 70 then moves the stage 60 by a predetermined amount in a direction −X to the next annealing position and repeats the same operation described above.

Annealing of a large number of annealing target areas located in the band-shaped area of the substrate 80, the band-shaped area extending along the direction X, is thus completed. Moving the areas irradiated with the pulsed laser light relative to the substrate 80 in the direction X and radiating the pulsed laser light to anneal the band-shaped area of the substrate 80 extending along the direction X is called scanning. The width of the scanning depends on the number of mask pattern openings 53 arranged in the direction Y. The band-shaped area where the scanning is performed is called a scan area. The scan area includes a large number of annealing target areas arranged in a grid pattern at fixed intervals in the directions X and Y.

When one scan area is scanned, the controller 70 moves the stage 60 in the direction −Y to change the area to be scanned and scans another scan area adjacent to the scan area having already been processed. In this process, the end of the N-th scanning is adjacent to the opposite end of the (N+1)-th scanning, where N is an integer greater than or equal to one.

Annealing of the required area of the substrate 80 is completed by repeating the operation described above to perform a plurality of scanning actions including the N-th scanning and the (N+1)-th scanning. The annealed portions (annealed areas) on the substrate 80 become polysilicon and each operate as part of a TFT. Annealing the substrate 80 is referred to as "workpiece processing" in some cases.

2. Problems

Figure 3:
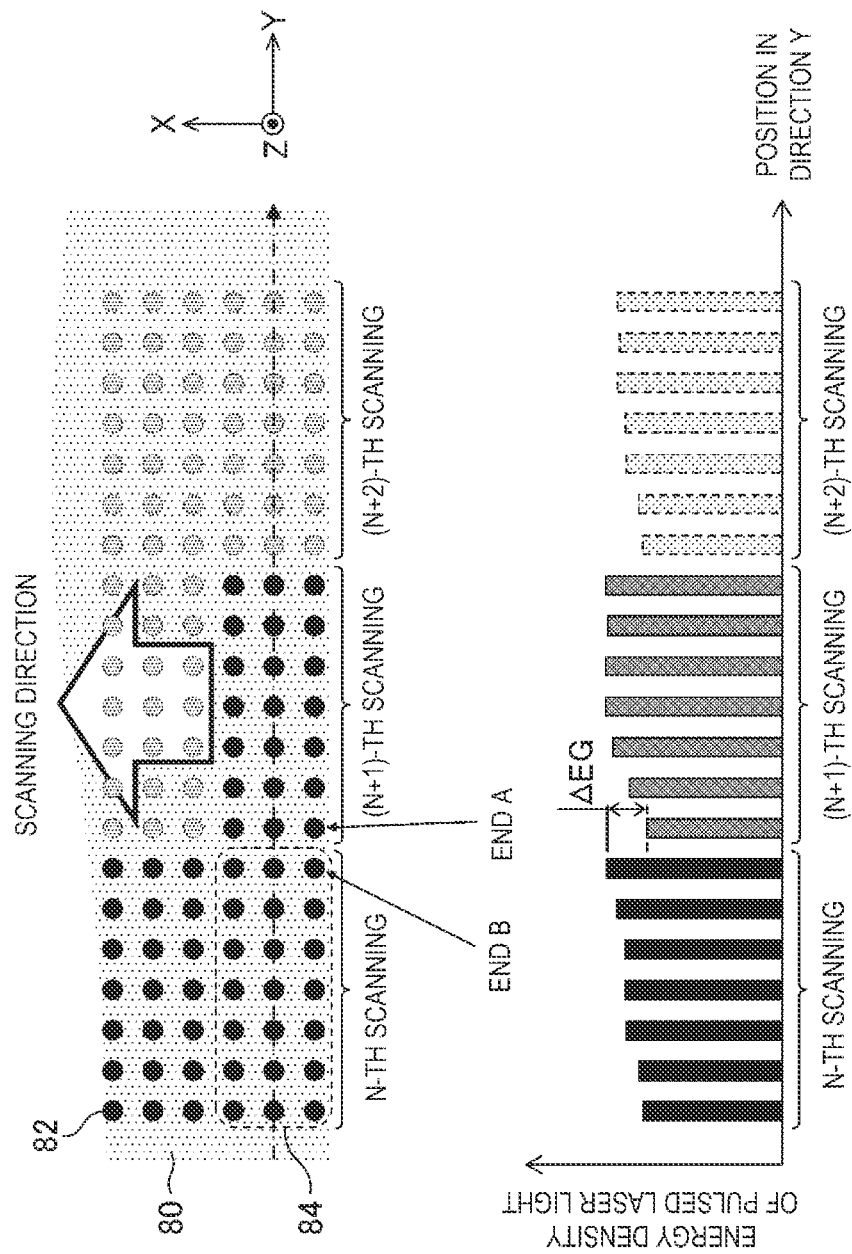
FIG. 3 describes a problem with the laser annealing apparatus.

FIG. 3 describes a problem with the laser annealing apparatus 10. The upper portion of FIG. 3 shows an example of the arrangement pattern of annealing target areas 82 on the substrate 80, and the lower portion of FIG. 3 shows the distribution of the energy density of the pulsed laser light with which each of the annealing target areas 82 on the substrate 80 is irradiated.

For simplicity, FIG. 3 shows an example of the mask pattern in which seven mask pattern openings 53 are arranged in the direction Y and three rows each containing the seven mask pattern openings 53 are arranged in the direction X on the mask 52, that is, a total of 3×7=21 mask pattern openings 53 are arranged on the mask 52. The number of mask pattern openings 53 in each of the rows extending along the direction Y is, of course, not limited to the number in the example described above and may be selected as appropriate in accordance with the laser apparatus 20 and the annealing conditions. The number of rows in the direction X is designed in accordance with the number of radiation actions of the pulsed laser light (number of pulses) with which one annealing target area 82 is irradiated. FIG. 3 shows a case where one annealing target area 82 is irradiated with the pulsed laser light three times (three pulses).

The 3×7 annealing target areas 82 on the substrate 80 are collectively irradiated with the pulsed laser light via the multipoint processing optical system 50. The area surrounded by the broken line in the upper portion of FIG. 3 is an example of a batch radiation area 84. The batch radiation area 84 has a pattern formed of 3×7 radiation areas to be irradiated with a bundle of pulsed laser light groups corresponding to the array of 3×7 annealing target areas 82. The laser annealing apparatus 10 thus radiates the pulsed laser light via the multipoint processing optical system 50 to a plurality of local areas (plurality of annealing target areas 82) discretely arranged on the surface of the substrate 80.

The laser annealing apparatus 10 scans the batch radiation area 84 by moving the batch radiation area 84 relative to the substrate 80 in the direction X. The upper portion of FIG. 3 diagrammatically shows that the N-th scanning has been completed and the (N+1)-th scanning has started. The (N+1)-th scan area, which is the area scanned by the (N+1)-th scanning action, is adjacent to and does not overlap with the N-th scan area, which is the area scanned by the N-th scanning action. That is, the areas scanned by the respective scanning actions are arranged in the direction Y without overlapping each other. The term "overlapping" used herein refers to the situation in which the same area is irradiated in different scanning actions with pulsed laser light having an energy density greater than or equal to a threshold that causes silicon modification. The silicon modification in this case includes a situation in which silicon melts and/or recrystallizes. The term "non-overlapping" therefore includes a situation in which the same area is irradiated in different scanning actions with pulsed laser light having an energy density so low that silicon modification does not occur.

The graph in the lower portion of FIG. 3 shows the distribution of the energy density of the pulsed laser light radiated to the positions of the annealing target areas along the direction Y that are located in the position in the direction X indicated by the two-dot chain line in the second row counted from the bottom in the annealing target area arrangement pattern shown in the upper portion of FIG. 3. The horizontal axis in the lower portion of FIG. 3 represents the position in the direction Y on the substrate 80.

The pulsed laser light is shaped by the illumination optical system 30 so as to have a roughly uniform energy density distribution in the direction Y, as described above. Depending on the shape adjustment state, however, there is a difference in some cases in energy density between an end A and an end B, which are ends opposite to each other in the direction Y in the batch radiation area 84. The difference may further change over time in some cases. The difference in energy density between the ends opposite to each other causes a discontinuous difference ΔEG in the energy density of the pulsed laser light, for example, between the end B of the N-th scan area and the end A of the (N+1)-th scan area, which is adjacent to the end B.

That is, the discontinuous difference ΔEG in FIG. 3 is the difference in the energy density between the pulsed laser light radiated at the right end (end B) in the N-th scan area and the pulsed laser light radiated at the left end (end A) in the (N+1)-th scan area. Similarly, a discontinuous energy density difference occurs at the right end of the (N+1)-th scan area and the left end in the (N+2)-th scan area.

Depending on the magnitude of the difference ΔEG, when the annealed substrate 80 is actually operated as a flat panel display (FPD), the difference ΔEG will be visually recognized in the form of "streaks" or "unevenness". The "streaks" or "unevenness" is believed to occur due to nonuniformity of the degree of silicon (Si) crystallization caused by the difference in energy density and is a major problem particularly in display devices used in displays, as the "streaks" or "unevenness" is a defect noticeable to human eyes. The defect leads in some cases to a decrease in yield of the display devices.

That is, when the substrate 80 is annealed by performing a plurality of scanning actions on scanning target areas separated from each other in the direction Y, the discontinuous difference in energy density at the joint between adjacent scanning target areas is highly likely to affect the quality of the FPD. To achieve the same illuminance at the ends opposite to each other, the uniformity of the illumination in the direction Y has been increased, for example, by adjusting the elements of the illumination optical system 30, but it is difficult to meet unnecessarily strict uniformity or maintain the uniformity of the illumination over a long period.

3. First Embodiment

3.1 Configuration

Figure 4:
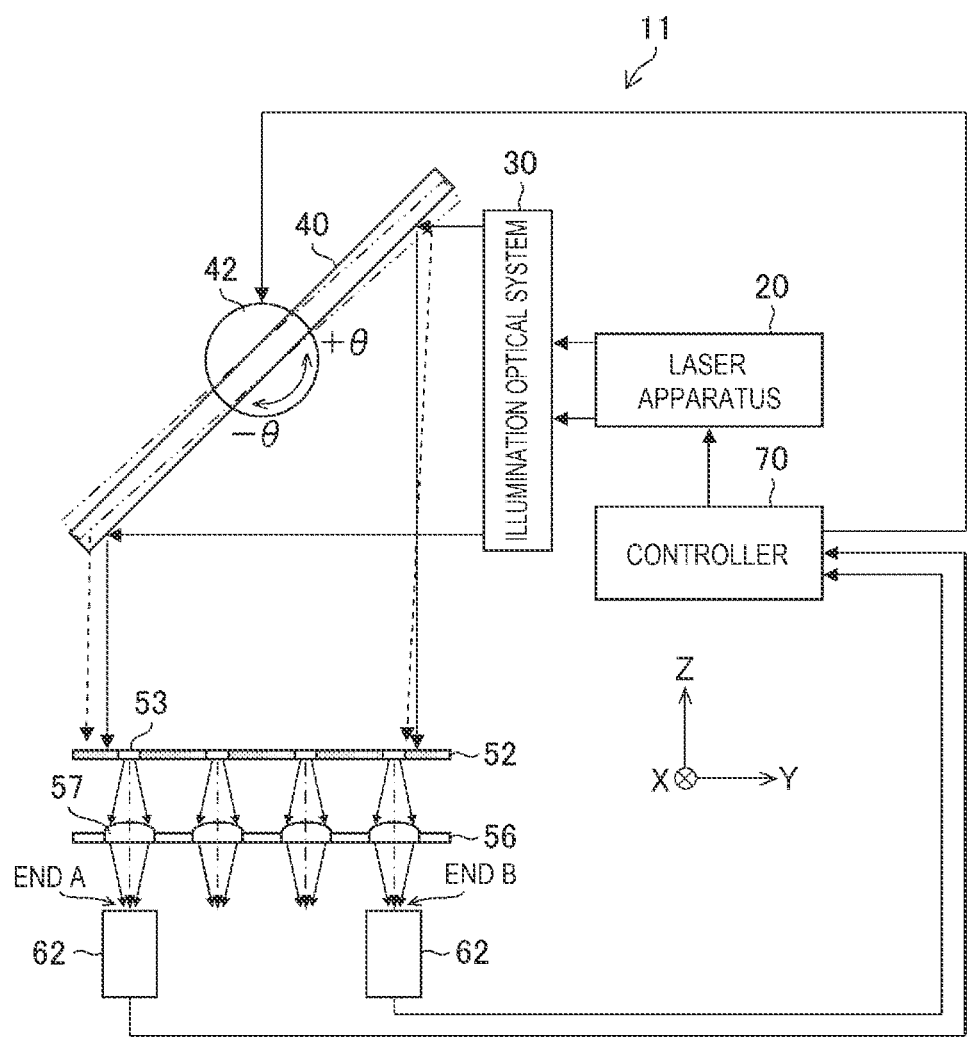
FIG. 4 schematically shows the configuration of a laser annealing apparatus according to a first embodiment.

FIG. 4 schematically shows the configuration of a laser annealing apparatus 11 according to a first embodiment. Differences in configuration between FIGS. 4 and 1 will be described. In the laser annealing apparatus 11 shown in FIG. 4, the illumination optical system 30 is so adjusted or configured that the energy density gradually decreases at the Y-direction end of the illumination light with which the mask 52 is illuminated. Furthermore, the laser annealing apparatus 11 includes energy density measuring devices 62 and a mirror actuator 42.

The energy density measuring devices 62 measure the energy density of the laser light at the ends of the plurality of annealing target areas 82 arranged in the direction Y in a single scanning action. The energy density may be measured only in the vicinity of the opposite ends of the batch radiation area 84 (single scan area) in the direction Y. In FIG. 4, to measure the energy density at each of the ends A and B, the energy density measuring device 62 is disposed in each of the positions corresponding to the ends. In a configuration in which the measurement is made only at the ends of the batch radiation area 84, as shown in FIG. 4, the energy density measuring device 62 may be a combination, for example, of an energy meter having sensitivity in the wavelength region of the pulsed laser light and an objective optical system.

The energy density measuring device 62 may instead be formed, for example, of a beam profiler that measures the energy density over the entire batch radiation area 84.

Figure 5:
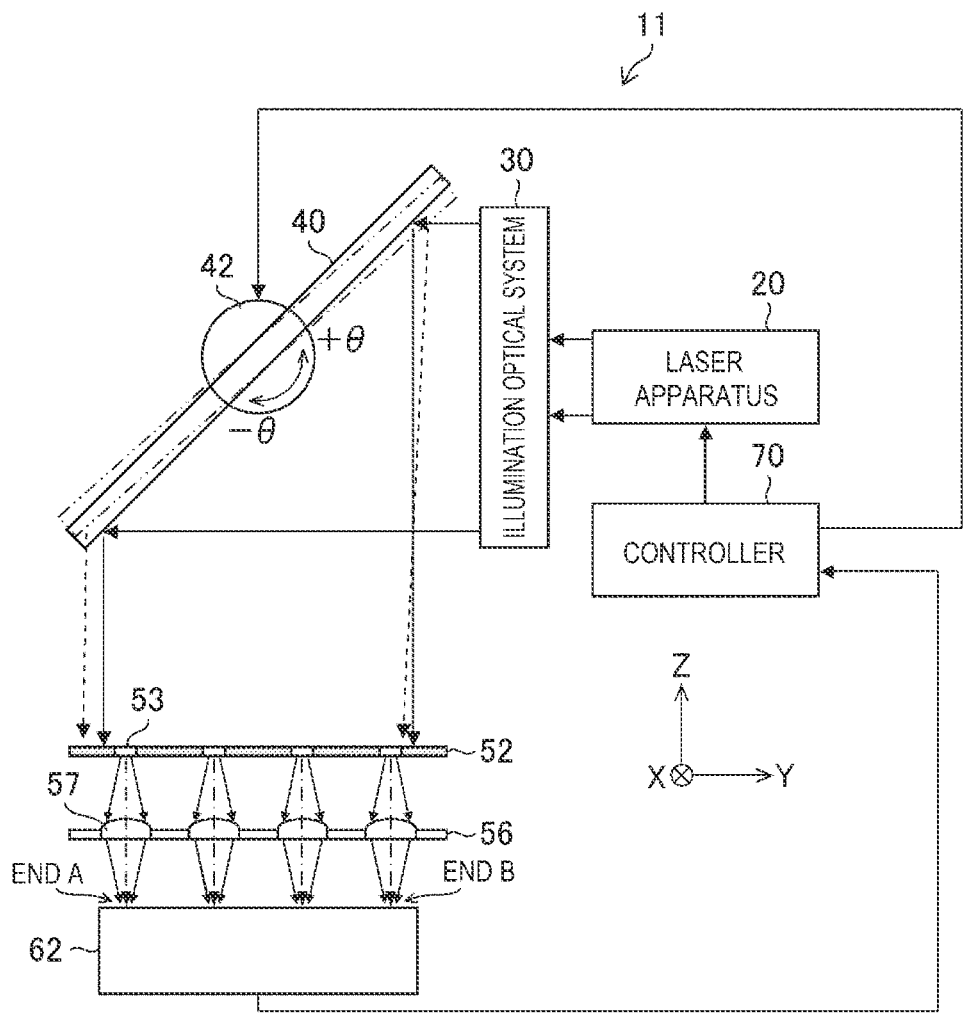
FIG. 5 shows another form of an energy density measuring device.

FIG. 5 shows another form of the energy density measuring device 62. In place of the configuration shown in FIG. 4, the configuration shown in FIG. 5 may be employed. To measure the energy density over the entire batch radiation area 84, as shown in FIG. 5, the energy density measuring device 62 may be a combination, for example, of a beam profiler that is capable of measuring the energy density at the wavelength of pulsed laser light and an optical system for light attenuation or beam enlargement/reduction.

The mirror actuator 42 includes a rotation mechanism that rotates the high-reflection mirror 40. The mirror actuator 42 is configured to adjust the angle at which the mask 52 is illuminated with the pulsed laser light shaped by the illumination optical system 30. The mirror actuator 42 may be a rotary stage operated, for example, by a stepper motor or a piezoelectric actuator. The angle of reflection at which the light is reflected off the high-reflection mirror 40 can be changed by driving the mirror actuator 42. That is, the mirror actuator 42 is configured to change, when driven, the energy density distribution of the pulsed laser light on the mask 52.

The energy density measuring device 62 and the mirror actuator 42 are each connected to the controller 70. The controller 70 controls the mirror actuator 42 based on the result of the measurement made by the energy density measuring device 62.

3.2 Operation

Before performing the workpiece processing, the energy density measuring device 62 is used to measure the energy densities at the ends A and B, which are the opposite ends of the batch radiation area 84 in the direction Y. The controller 70 rotates the mirror actuator 42 in a predetermined direction and measures the energy densities at the opposite ends. The controller 70 repeats the operation of successively changing the angle of rotation provided by the mirror actuator 42 over a predetermined angular range and measuring the energy densities at the opposite ends for each angle of rotation to acquire the angular characteristics of the end energy densities. The predetermined angular range preferably includes angles of rotation in the opposite directions "+θ" and "−θ" from a reference angle of rotation corresponding to a reference position of the high-reflection mirror 40.

Figure 6:
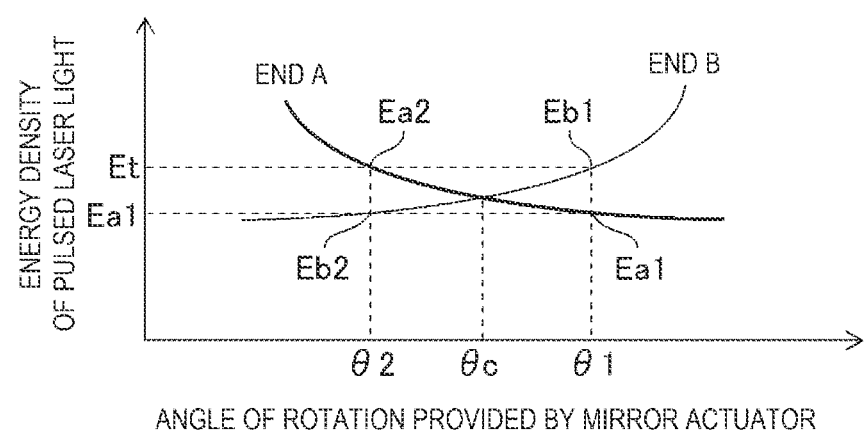
FIG. 6 shows graphs illustrating an example of the angular characteristics of end energy densities.

FIG. 6 shows graphs illustrating an example of the angular characteristics of the end energy densities. The horizontal axis represents the angle of rotation provided by the mirror actuator 42, and the vertical axis represents the energy density of the pulsed laser light. The angle of rotation of the mirror actuator 42 is hereinafter referred to as a "mirror angle".

Let $Ea1$ and $Eb1$ be the energy densities at the ends A and B, respectively, with the mirror angle being $θ1$ and $Ea2$ and $Eb2$ be the energy densities at the ends A and B, respectively, with the mirror angle being $θ2$. In this example, it is assumed that $Eb1=Et$, and $Et≈Ea2$ and $Ea1≈Eb2$ are satisfied.

On the other hand, there is a mirror angle $θc$, at which the energy densities at the ends A and B are equal to each other, in the present example. When there is the mirror angle $θc$, at which the energy densities at the ends A and B are equal to each other, as described above, a plurality of scanning actions may be successively performed with the mirror angle fixed at $θc$.

Figure 7:
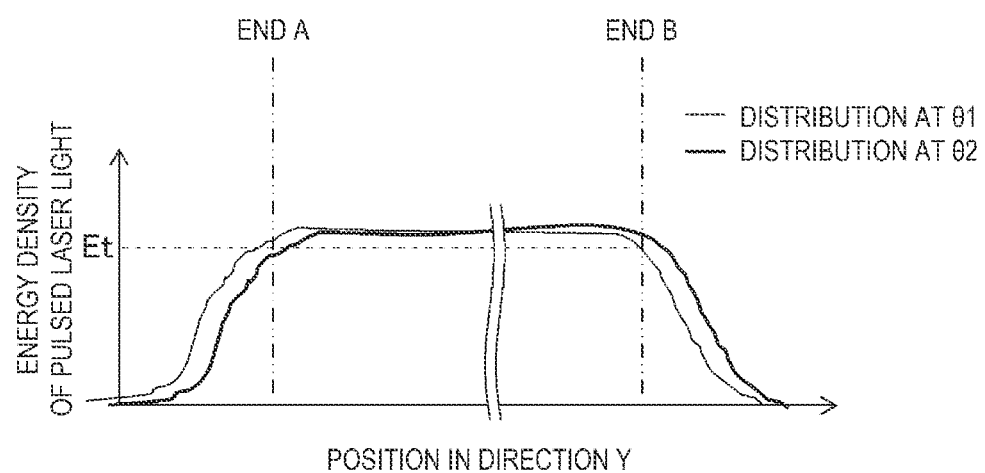
FIG. 7 shows an example of the energy density distribution of the pulsed laser light in each of the cases where a mirror angle is θ1 and θ2.

FIG. 7 shows an example of the energy density distribution of the pulsed laser light in each of the cases where the mirror angle is $θ1$ and $θ2$. The horizontal axis of FIG. 7 represents the position in the direction Y. The energy density distribution of the pulsed laser light in an irradiated area changes depending on the mirror angle, as shown in FIG. 7.

In the energy density distributions, the energy densities change in the vicinity of each of the ends A and B. The energy density at each of the ends A and B can therefore be adjusted by changing the mirror angle.

The N-th scanning is then performed, for example, with the mirror angle fixed at $θ1$ during the workpiece processing.

Thereafter, in the next (N+1)-th scanning, the mirror angle is so set at $θ2$ that the energy density at the end A coincides with the energy density Et at the end B at the time of the N-th scanning, and the scanning is performed with the position of the high-reflection mirror 40 fixed. The term "coincidence" may include substantial coincidences regarded as an acceptable range.

Thereafter, the entire surface of the workpiece is processed in the same manner described above by switching the mirror angle from $θ1$ to $θ2$, back to $θ1$, . . . whenever the scanning is performed.

Figure 8:
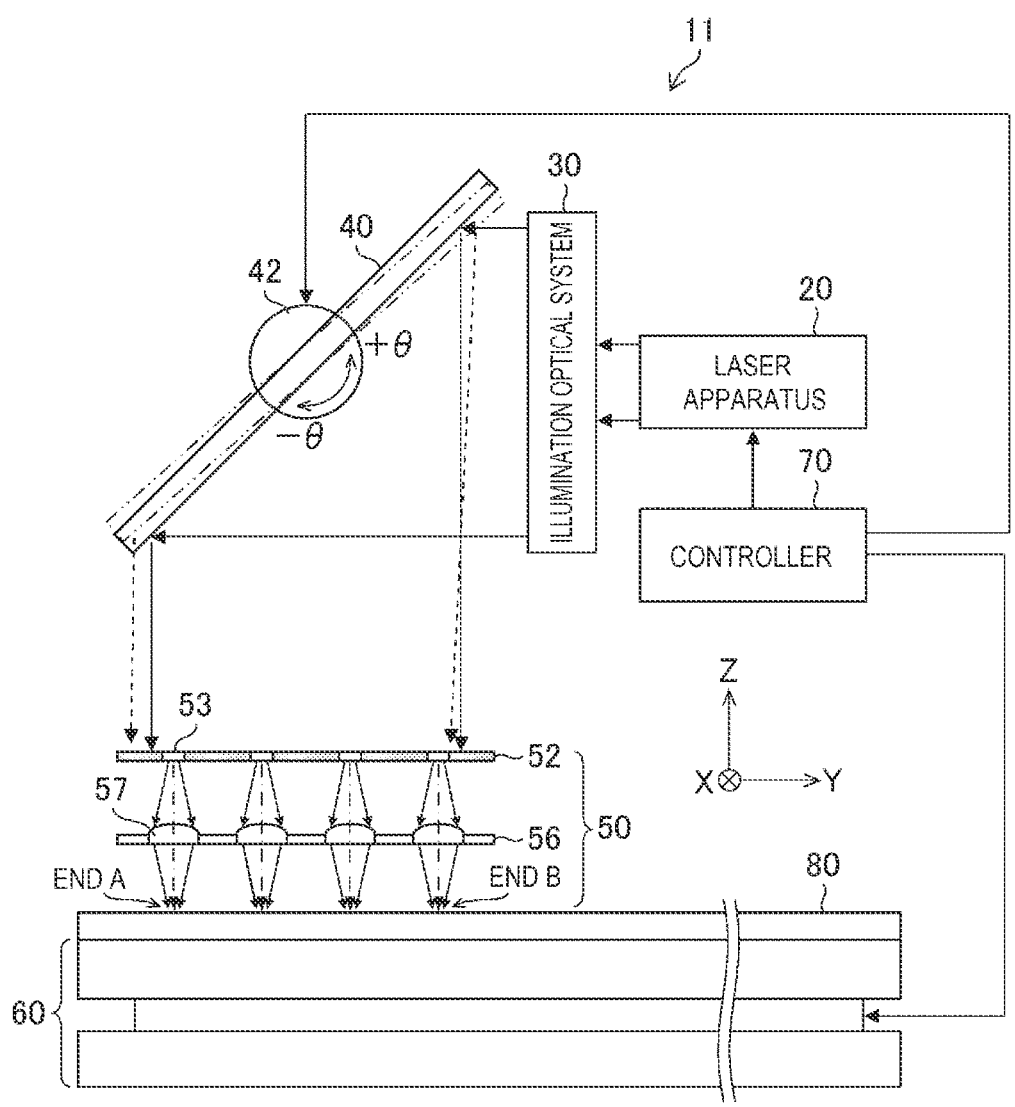
FIG. 8 shows the operation of the laser annealing apparatus during workpiece processing.

FIG. 8 shows the operation of the laser annealing apparatus 11 during the workpiece processing. The controller 70 controls the switching of the angle of rotation of the mirror actuator 42 whenever the scanning is performed. That is, the controller 70 controls the mirror actuator 42 in such a way that the mirror angle is $θ1$ in the N-th scanning, $θ2$ in the next (N+1)-th scanning, $θ1$ in the next (N+2)-th scanning, and so on.

Figure 9:
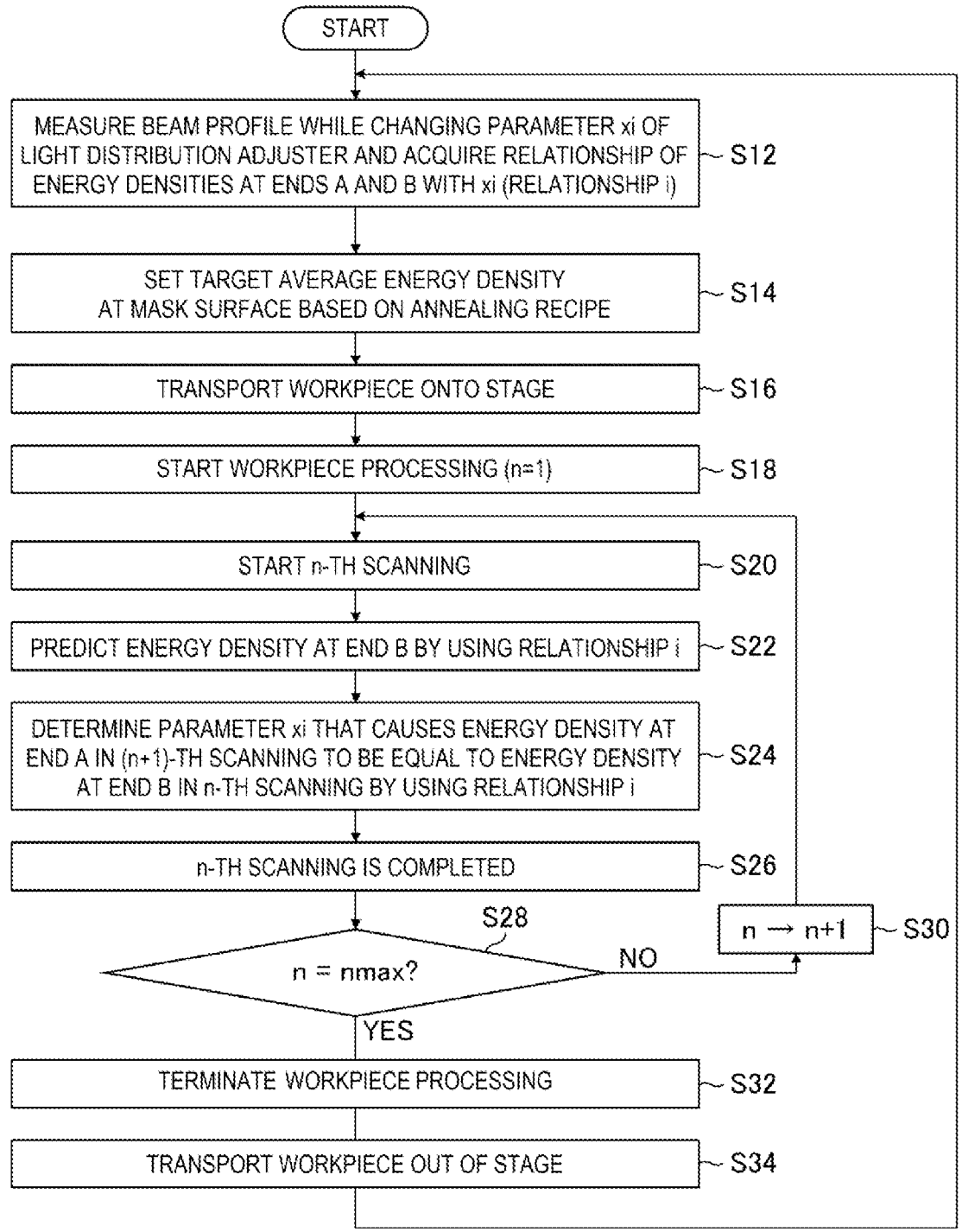
FIG. 9 is a flowchart showing an example of the operation of the laser annealing apparatus according to the first embodiment

FIG. 9 is a flowchart showing an example of the operation of the laser annealing apparatus 11 according to the first embodiment. FIG. 9 shows a case where the energy density measuring device 62 shown in FIG. 5 is used. The mirror actuator 42 is one form of a light distribution adjuster that adjusts the energy density distribution.

In step S12, the controller 70 measures the beam profile with the energy density measuring device 62 while changing a parameter xi of the light distribution adjuster and acquires the relationship of the energy densities at the ends A and B with the parameter xi (relationship i). The parameter xi in the mirror actuator 42 is the mirror angle θ. The relationship shown in FIG. 6, for example, is acquired by carrying out step S12. Information on the angular characteristics of the end energy density shown in FIG. 6 is an example of the "relationship information" in the present disclosure. The parameter xi and the mirror angle θ are each an example of the "amount of adjustment" in the present disclosure.

In step S14 of FIG. 9, the controller 70 sets a target average energy density at the mask surface based on an annealing recipe.

In step S16, the controller 70 transports the substrate 80, which is the workpiece, onto the stage 60.

In step S18, the controller 70 sets a variable n, which represents the count of the number of scanning actions, at an initial value of "1" and starts the work processing.

In step S20, the controller 70 starts the n-th scanning operation.

In step S22, the controller 70 predicts the energy density at the end B by using the relationship i.

In step S24, the controller 70 determines the parameter xi that causes the energy density at the end A in the (n+1)-th scanning to be equal to the energy density at the end B in the n-th scanning by using the relationship i. Determining the parameter xi that causes the energy density at the end A in the (n+1)-th scanning equal to the energy density at the end B in the n-th scanning is an example of controlling the energy density at the end A in the (n+1)-th scanning to approach the energy density at the end B in the n-th scanning.

In step S26, when the n-th scanning is completed, the controller 70 proceeds to step S28. In step S28, the controller 70 evaluates whether the variable n has reached a default maximum value nmax. The parameter nmax may, for example, be the number of scanning actions required to process the entire workpiece surface.

When the result of the evaluation in step S28 is No, the controller 70 proceeds to step S30, where the controller 70 increments the variable n, and returns to step S20. The controller 70 repeats steps S20 to S30 until the variable n reaches nmax. Eventually, when the variable n becomes equal to nmax and the result of the evaluation in step S28 therefore becomes Yes, the controller 70 proceeds to step S32, where the controller 70 terminates the workpiece processing.

In step S34, the controller 70 then transports the processed workpiece out of the stage 60. To process the next workpiece, the controller 70 returns after step S34 to step S12 and repeats the processes in steps S12 to S34.

After step S34, when there is no need to process the next workpiece, the controller 70 may terminate the flowchart in FIG. 9.

FIG. 9 shows the case where the process in step S12 is first carried out and the following steps are then carried out on a workpiece basis, but the timing at which step S12 is carried out is not limited to the timing in the case described above. For example, the following aspects are also conceivable: an aspect in which step S12 is carried out only when the laser annealing apparatus 11 is activated; an aspect in which step S12 is carried out when the count of the number of processed workpieces reaches a specified number; an aspect in which step S12 is carried out regularly in accordance with a predetermined maintenance cycle based, for example, on management of operating hours; and other aspects.

The following aspects are still further conceivable: an aspect in which step S12 is carried out when a processed workpiece is inspected or otherwise checked and the result of the inspection shows that "streaks" or "unevenness" may undesirably occur; and an aspect in which step S12 is carried out at an appropriate timing in accordance with an instruction inputted from a user.

In a case where there is no change in the annealing recipe when a new workpiece is processed after step S34 in the flowchart of FIG. 9, the process in step S14 may be skipped.

3.3 Effects and Advantages

Figure 10:
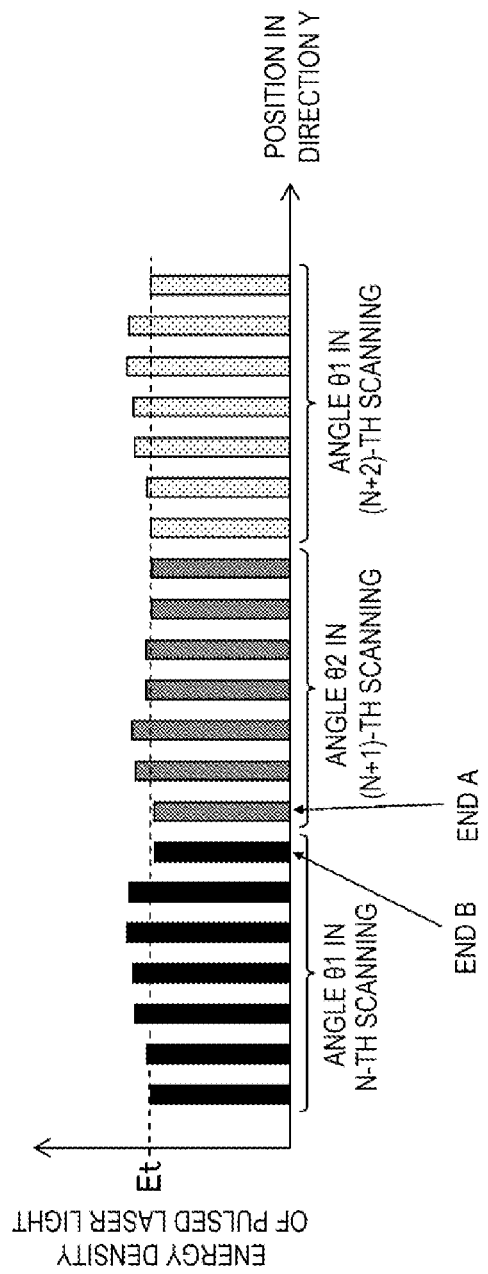
FIG. 10 is a descriptive diagram showing the effects provided by the first embodiment.

FIG. 10 is a descriptive diagram showing the effects provided by the first embodiment. As is clearly shown by a comparison with the lower portion of FIG. 3, the first embodiment allows reduction in the difference between the energy density at the end B in the N-th scanning and the energy density at the end A in the (N+1)-th scanning adjacent thereto. As a result, when the annealed substrate 80 is operated, for example, as an FPD, "streaks" or "unevenness" is unlikely to be visually recognized. The yield of the FPD can thus be improved.

The end A in the first embodiment is an example of the "first end" in the present disclosure, and the end B in the first embodiment is an example of the "second end" in the present disclosure. The annealing target areas 82 are each an example of the "processing receiving area" in the present disclosure. The direction parallel to the direction X is an example of the "first direction" in the present disclosure, and the direction parallel to the direction Y is an example of the "second direction" in the present disclosure. The high-reflection mirror 40 and the multipoint processing optical system 50 are an example of the "optical system" in the present disclosure. The high-reflection mirror 40 is an example of the "mirror" in the present disclosure. The stage 60 is an example of the "relative movement apparatus" in the present disclosure. The energy density measuring device 62 is an example of the "energy density measuring apparatus" in the present disclosure. Out of the two energy density measuring devices 62 shown in FIG. 4, the energy density measuring device 62 on the right side is an example of the "measuring device for a first end" in the present disclosure, and the energy density measuring device 62 on the left side is an example of the "measuring device for a second end" in the present disclosure. The mirror actuator 42 is an example of the "energy density adjusting apparatus" in the present disclosure.

3.4 First Variation

3.4.1 Configuration

Figure 11:
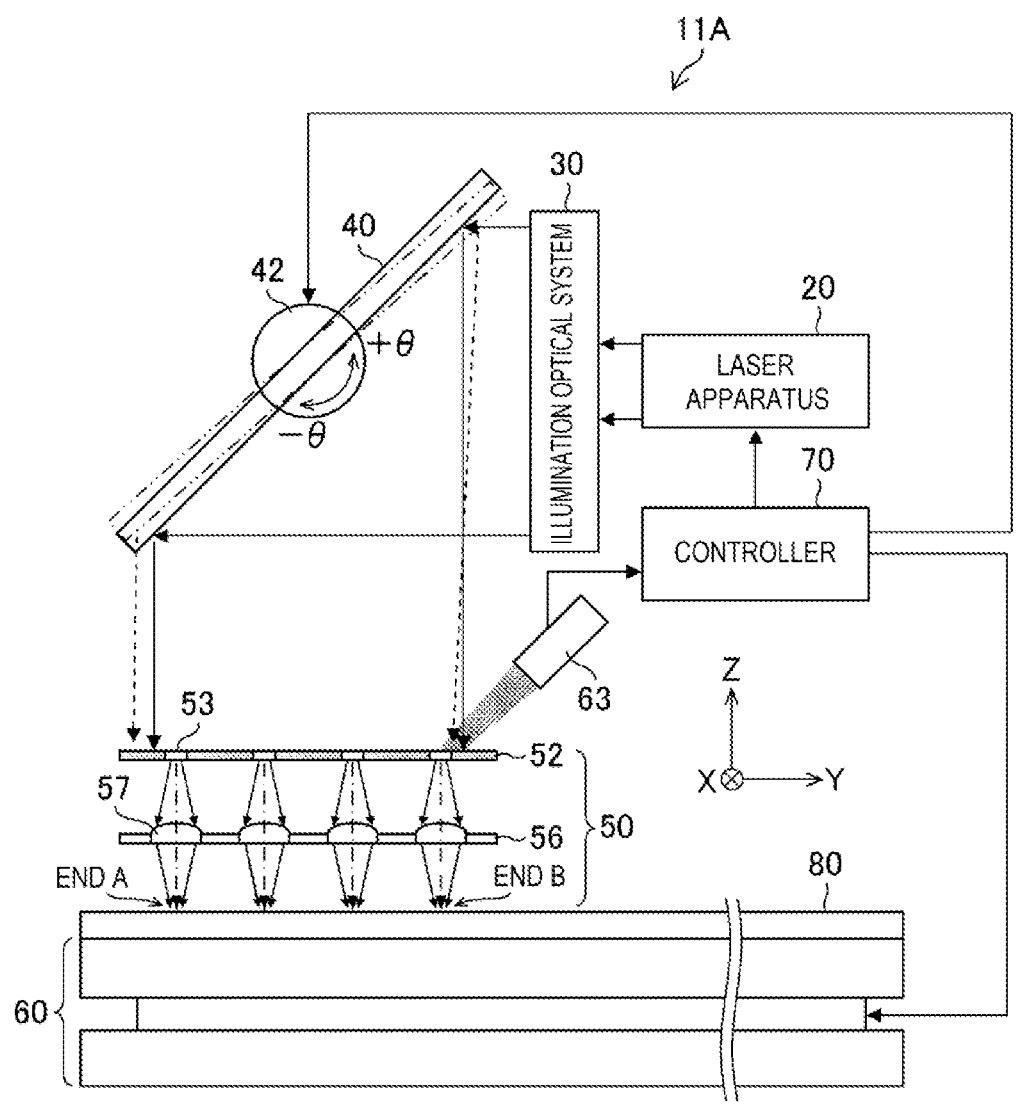
FIG. 11 schematically shows the configuration of a laser annealing apparatus according to a first variation of the first embodiment.

FIG. 11 schematically shows the configuration of a laser annealing apparatus 11A according to a first variation of the first embodiment. Differences in configuration between FIGS. 11 and 4 will be described.

The laser annealing apparatus 11A shown in FIG. 11 includes an energy density measuring device 63 that is capable of measuring the energy density even during workpiece processing. The energy density can be measured at either the mask surface or the workpiece surface. The energy density measuring device 63 shown in FIG. 11 measures the energy density at the mask surface. The energy density measuring device 63 may be a combination of an energy meter and an objective optical system so as to measure the energy density at an end of the roughly rectangular area illuminated with the pulsed laser light with which the mask 52 is illuminated.

Figure 12:
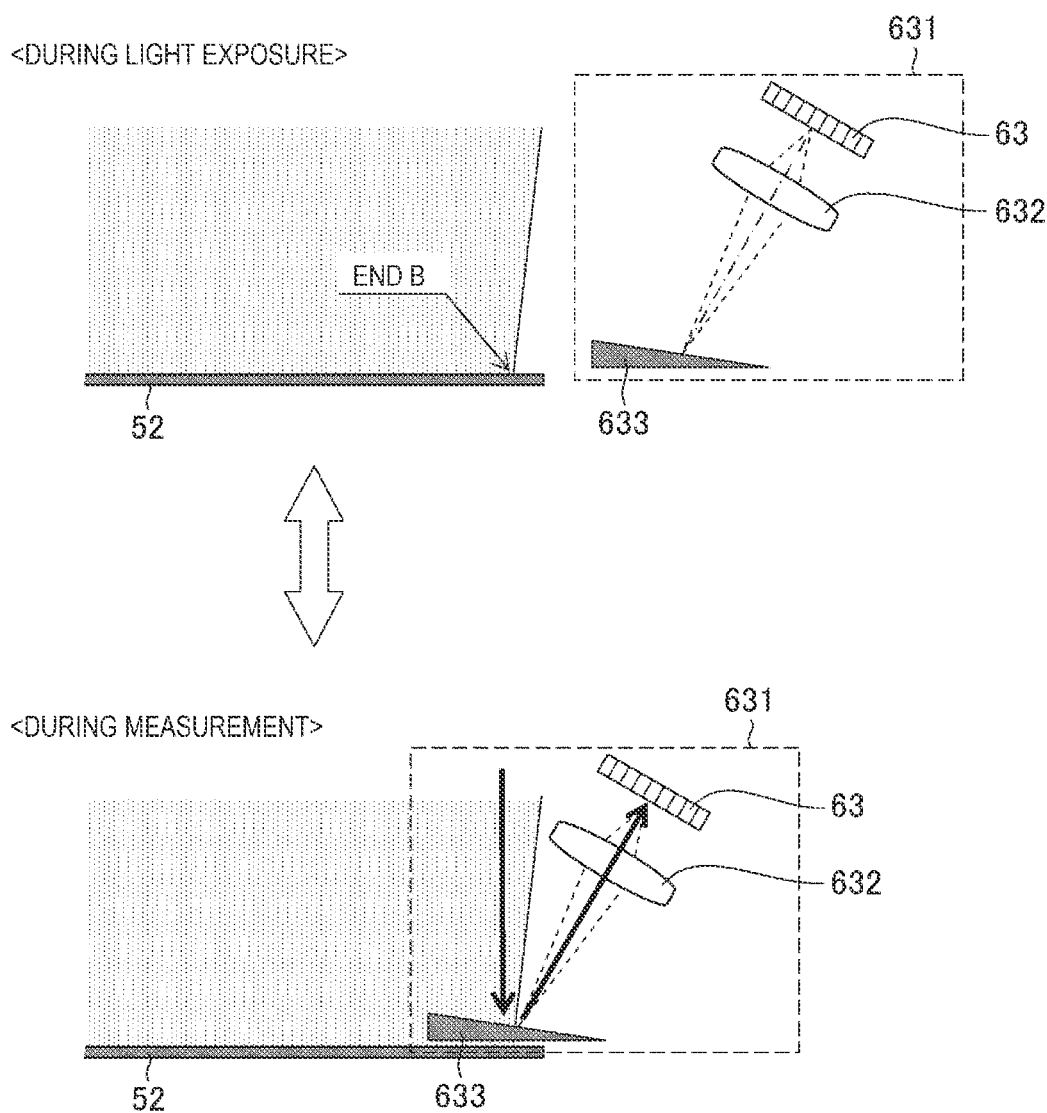
FIG. 12 shows an example of the form of measurement of the energy density at a mask surface.

To measure the energy density along an oblique direction as shown in FIG. 12, a movable mirror unit 631 may be used. The movable mirror unit 631 is configured to be capable of moving a tilted movable mirror 633 to a position outside the radiation range and to a position on the mask 52. The movable mirror 633 is moved to a position on the mask 52 and within the radiation range only when the optical intensity distribution is measured, and the light reflected off the movable mirror 633 is guided to the energy density measuring device 63. The energy density measuring device 63 is preferably so disposed that an objective optical system 632 causes the energy density measuring device 63 to be conjugate with the mask surface and therefore be capable of measuring the energy density at the radiation end surface.

When there is a pattern on the mask surface and the energy density distribution can be measured by detecting the light scattered by the pattern, the energy density measuring device 63 may be so disposed as to directly detect the energy density from obliquely above as shown in FIG. 11 without use of the movable mirror unit 631.

Figure 13:
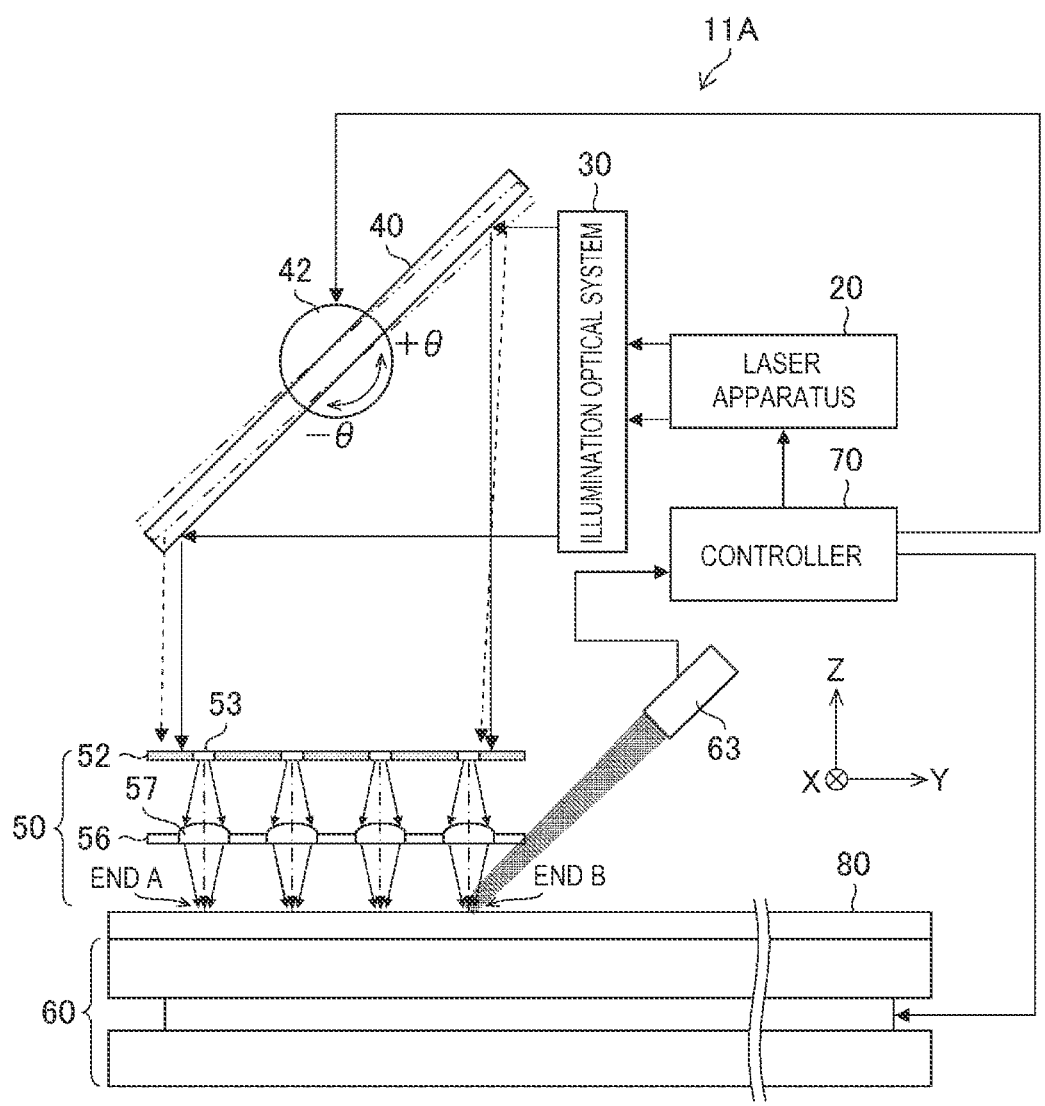
FIG. 13 shows an example of the form of measurement of the energy density at a workpiece surface.

FIG. 13 shows an example of the form of measurement of the energy density at the workpiece surface. The configuration shown in FIG. 13 may be employed in place of the configuration shown in FIG. 11. The energy density measuring device 63 shown in FIG. 13 may, for example, be a radiation thermometer. The energy density measuring device 63 may employ a configuration in which the substrate 80 is heated by actually radiating the pulsed laser light to the substrate 80 and other components so that the temperatures thereof increase and the temperature of the annealing target areas 82 is measured with the radiation thermometer, as shown in FIG. 13.

Figure 14:
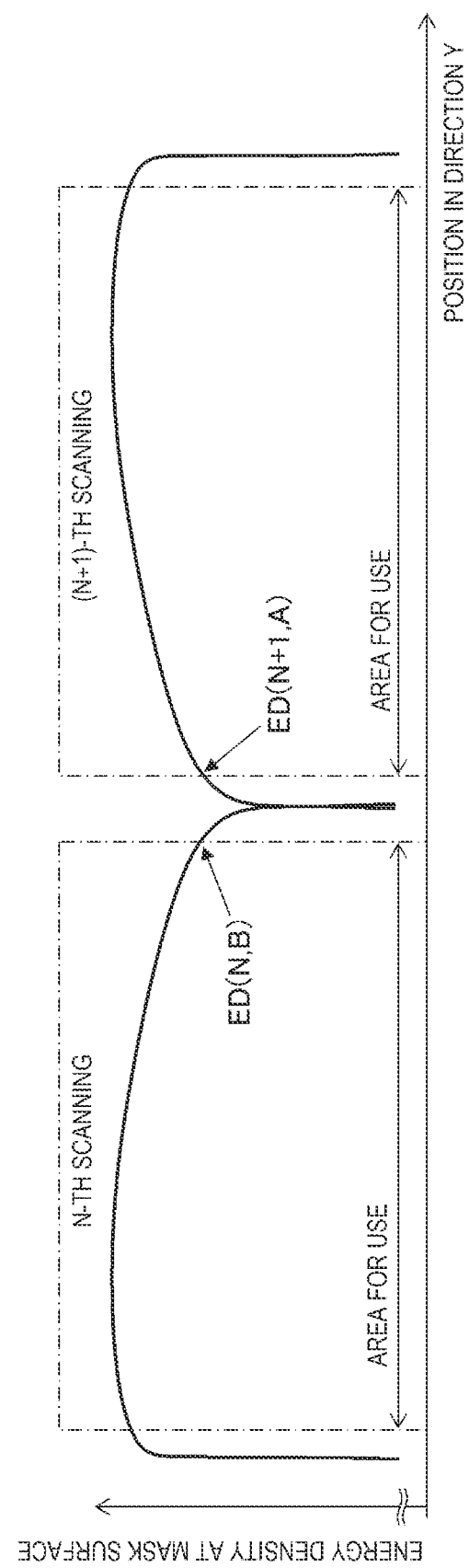
FIG. 14 shows graphs illustrating an example of the energy density distribution of the pulsed laser light at the mask surface achieved by the operation of the laser annealing apparatus according to the first variation of the first embodiment.

FIG. 14 shows graphs illustrating an example of the energy density distribution of the pulsed laser light at the mask surface achieved by the operation of the laser annealing apparatus 11A. FIG. 14 shows an example of the energy density at the mask surface in a case where the mirror actuator 42 is so controlled that an energy density ED (N, B) at the end B in the N-th scanning is roughly equal to an energy density ED (N+1, A) at the end A in the (N+1)-th scanning.

To facilitate the adjustment of the energy density, the illumination optical system 30 in the laser annealing apparatus 11A is so adjusted that the energy density at the Y-direction end of the illumination light on the mask 52 gradually decreases, as shown in FIG. 14. Such a distribution can be readily achieved because the Y-direction end falls within a boundary area of the end of the uniformly illuminated area.

3.4.2 Operation

In the N-th scanning, the controller 70 acquires the energy density of the pulsed laser light at the end B of the annealing target area during the annealing process with the energy density measuring device 63 and stores the acquired energy density. That is, the energy density measuring device 63 performs the measurement during the N-th scanning operation.

In the (N+1)-th scanning, the controller 70 controls the mirror actuator 42 in such a way that the energy density produced when the end A adjacent to the end B in the N-th scanning is annealed is equal to the energy density measured at the end B in the N-th scanning. The energy density at the end B in the (N+1)-th scanning is also measured at this point in preparation for the next adjustment.

When the mirror actuator 42 is driven, the energy density distribution of the pulsed laser light with which the mask 52 is illuminated changes.

Figure 15:
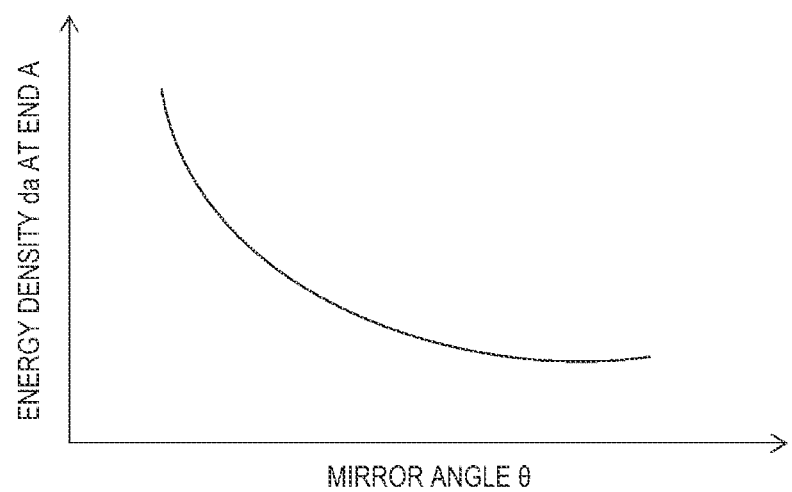
FIG. 15 is a graph showing an example of the relationship between a mirror angle θ and an energy density da at an end A.

FIG. 15 is a graph showing an example of the relationship between the mirror angle θ and an energy density da at the end A. For example, the energy density at the end A can be increased by rotating the high-reflection mirror 40 in a direction −θ, as shown in FIG. 15. Conversely, the energy density at the end A can be lowered by rotating the high-reflection mirror 40 in a direction +θ.

The controller 70 stores the relationship between the angle of rotation of the high-reflection mirror 40 and the energy density at the end A, such as the relationship shown in FIG. 15. The controller 70 then drives the mirror actuator 42 in such a way that the energy density at the end B in the N-th scanning measured with the energy density measuring device 63 is achieved at the end A in the (N+1)-th scanning. The relationship between the angle of rotation and the energy density shown in FIG. 15 may be obtained from data experimentally measured in advance or may be given, for example, in the form of an approximation formula. The controller 70 may include a memory that stores the relationship.

Although not shown in FIG. 11, the laser annealing apparatus 11A may include an energy density measuring device that measures the energy density at the end A.

The controller 70 stops the laser output after the number of laser radiation actions or the laser radiation period that causes the annealing target areas to be sufficiently annealed is reached or elapses.

The controller 70 then moves the stage 60 by a predetermined amount in the direction −X to the annealing start position of the next radiation area and repeats the same operation described above.

Annealing of all the annealing target areas 82 in the required area of the substrate 80 is completed by repeating the same operation described above in the (N+2)-th and the following scanning actions.

Figure 16:
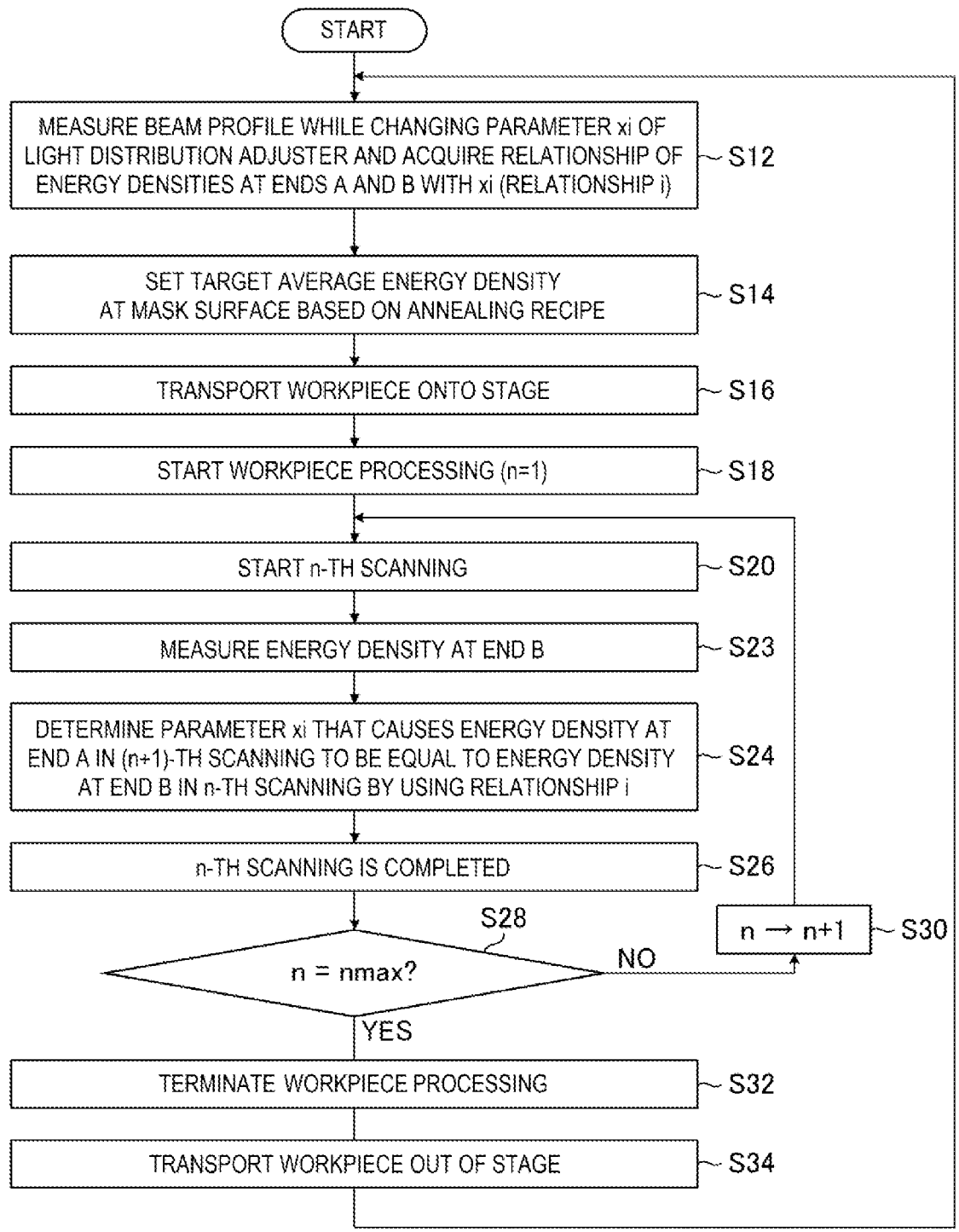
FIG. 16 is a flowchart showing an example of the operation of the laser annealing apparatus according to the first variation of the first embodiment.

FIG. 16 is a flowchart showing an example of the operation of the laser annealing apparatus 11A according to the first variation of the first embodiment. Differences in the flowchart between FIGS. 16 and 9 will be described. The flowchart shown in FIG. 16 includes step S23 in place of step S22 in FIG. 9.

In step S23, the controller 70 measures the energy density at the end B with the energy density measuring device 63 during workpiece processing. After step S23, the controller 70 proceeds to step S24. The other processes are the same as those in the flowchart of FIG. 9.

3.4.3 Effects and Advantages

Figure 17:
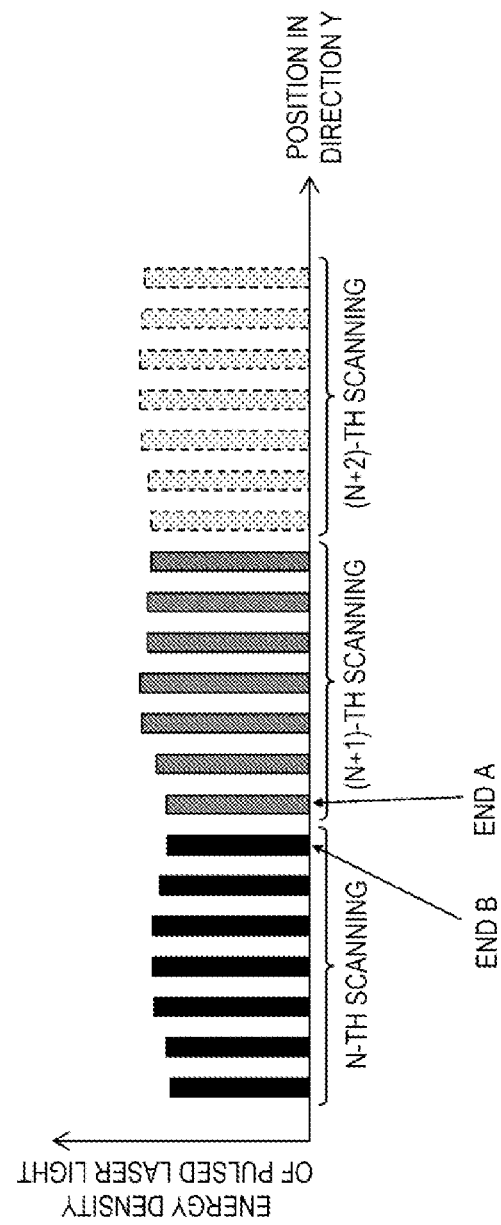
FIG. 17 shows the effects of the laser annealing apparatus according to the first variation of the first embodiment.

FIG. 17 shows the effects of the laser annealing apparatus 11A in the present first variation. According to the present first variation, the controller 70 controls the mirror actuator 42 in such a way that the energy density produced when the end A in the (N+1)-th scanning adjacent to the end B in the N-th scanning is annealed approaches the energy density measured at the end B in the N-th scanning. The difference in energy density between adjacent ends can thus be reduced.

As a result, when the annealed substrate is operated as an FPD, "streaks" or "unevenness" is unlikely to be visually recognized. The yield of the FPD can thus be improved.

3.5 Second Variation

3.5.1 Configuration

Figure 18:
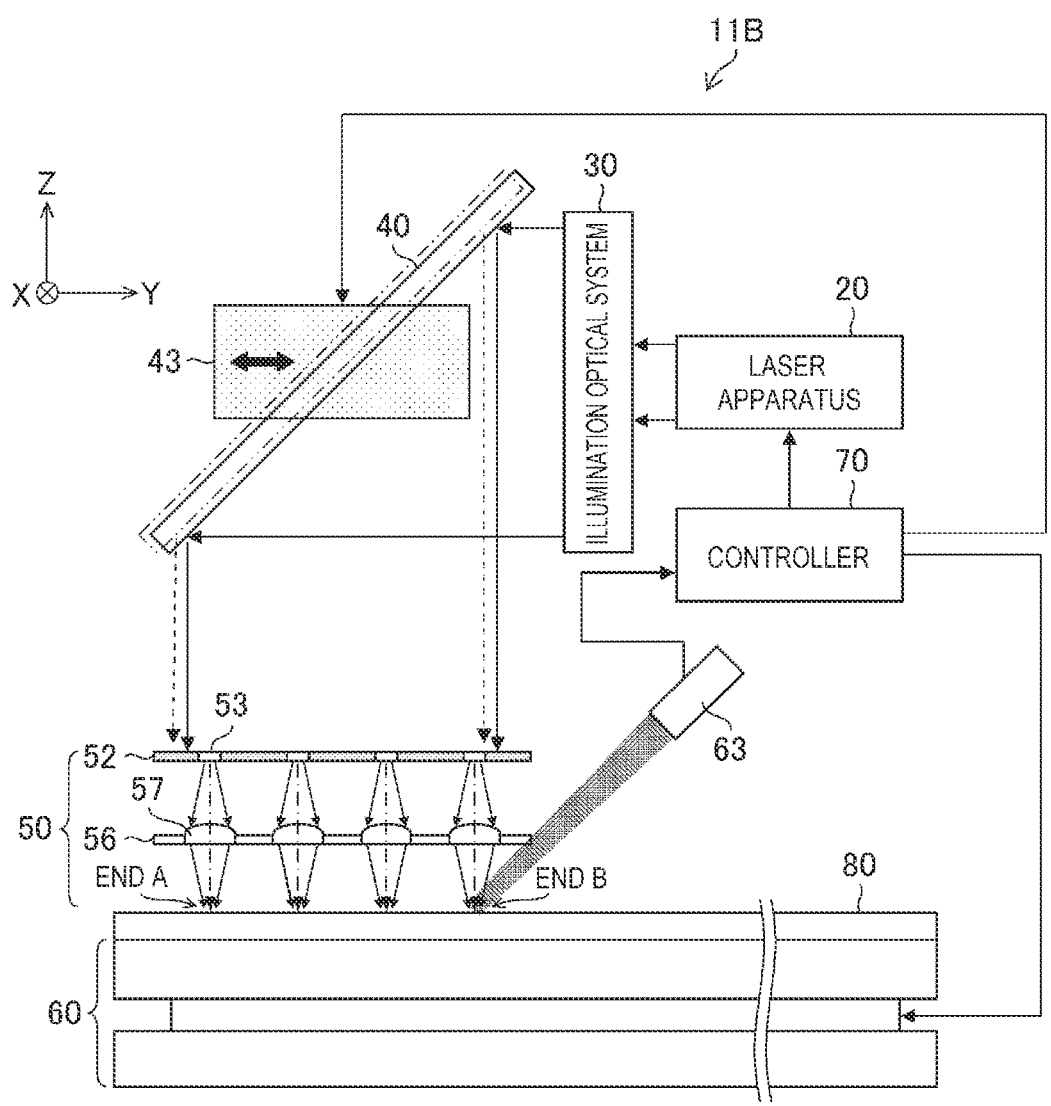
FIG. 18 schematically shows the configuration of a laser annealing apparatus according to a second variation of the first embodiment.

FIG. 18 schematically shows the configuration of a laser annealing apparatus 11B according to a second variation of the first embodiment. Differences in configuration between FIGS. 18 and 13 will be described. The laser annealing apparatus 11B shown in FIG. 18 includes a linear-motion mirror actuator 43 in place of the mirror actuator 42 in FIG. 13. That is, the mirror actuator 43 translates the high-reflection mirror 40 in the direction Y instead of rotating the high-reflection mirror 40.

The mirror actuator 43 is configured to adjust the position of the pulsed laser light which is shaped by the illumination optical system 30 and with which the mask 52 is illuminated. The mirror actuator 43 may be a linear motion stage driven, for example, by a linear motor, a stepper motor, or a piezoelectric actuator and may include a linear guide, a ball screw, and other components. The mirror actuator 43 is an example of the "mirror moving mechanism" in the present disclosure.

The illumination optical system 30 shapes the pulsed laser light in such a way that the mask 52 is illuminated with the shaped pulsed laser light, and guides the shaped pulsed laser light to the high-reflection mirror 40. In this process, the energy density at the Y-direction end of the mask 52 is so adjusted that the energy density has a distribution that covers the end of a radiation range and shows a characteristic that causes the energy density decreases outward from the radiation area.

Figure 19:
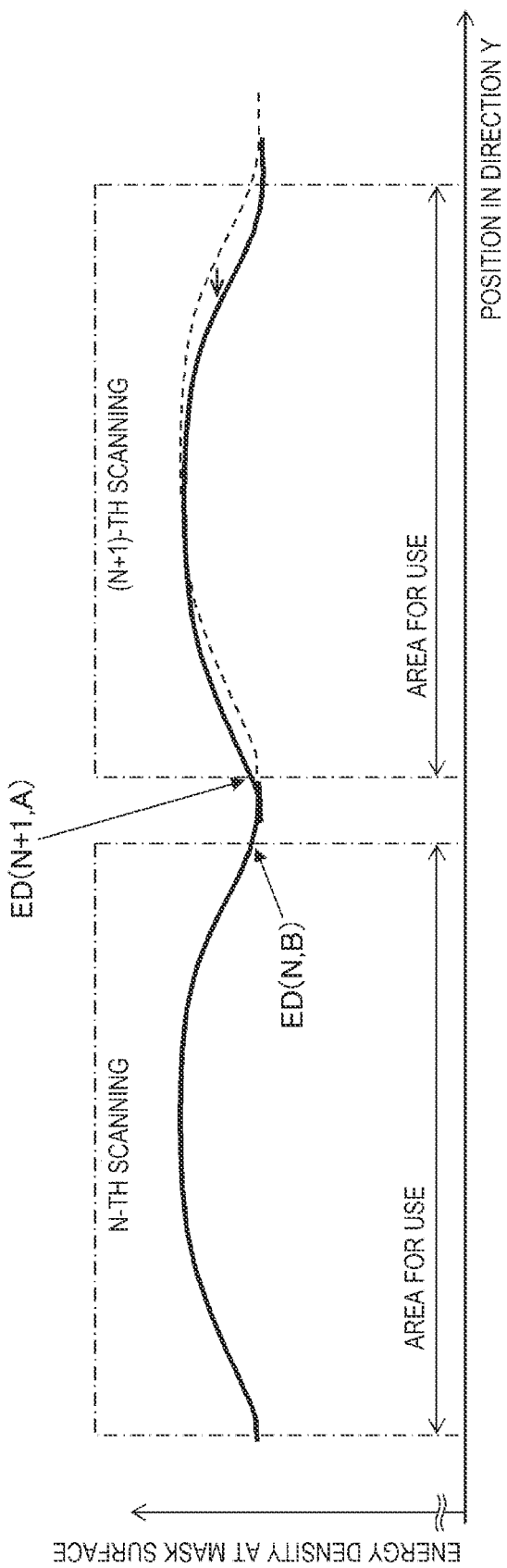
FIG. 19 is a graph showing an example of the energy density distribution of pulsed laser light at the mask surface achieved by the operation of the laser annealing apparatus according to the second variation of the first embodiment.

FIG. 19 is a graph showing an example of the energy density distribution of pulsed laser light at the mask surface achieved by the operation of the laser annealing apparatus 11B. FIG. 19 shows an example of the energy density at the mask surface in a case where the mirror actuator 43 is so controlled that the energy density ED (N, B) at the end B in the N-th scanning is roughly equal to the energy density ED (N+1, A) at the end A in the (N+1)-th scanning. In the (N+1)-th scanning, the mirror actuator 43 is controlled so as to change the energy density distribution from the distribution drawn with the broken line to the distribution drawn with the solid line. In FIG. 19, the difference in the energy density is exaggerated for ease of illustration. In practice, the difference in the energy density between the end and the center is set at a degree small enough not to be visually recognized as "unevenness" when the annealed portion is operated as an FPD even in consideration of the movable range of the high-reflection mirror 40.

Instead of using the energy density measuring device 63 shown in FIG. 18, the energy density may be measured at the mask surface, as shown in FIG. 11.

3.5.2 Operation

Figure 20:
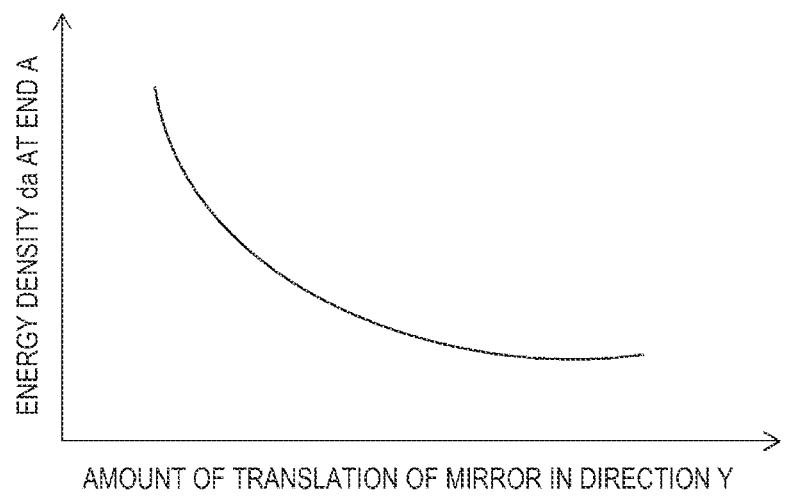
FIG. 20 is a graph showing an example of the relationship between the amount of translation of a high-reflection mirror in the direction Y performed by a mirror actuator and the energy density da at the end A.

When the mirror actuator 43 is driven, the energy density distribution of the pulsed laser light with which the mask 52 is illuminated changes. FIG. 20 is a graph showing an example of the relationship between the amount of translation of the high-reflection mirror 40 in the direction Y performed by the mirror actuator 43 and the energy density da at the end A. For example, the energy density at the end A can be increased by translating the high-reflection mirror 40 in the direction −Y, as shown in FIG. 20. Conversely, the energy density at the end A can be lowered by translating the high-reflection mirror 40 in the direction +Y.

3.5.3 Effects and Advantages

The laser annealing apparatus 11B provides the same effects as those provided by the laser annealing apparatus 11A in FIG. 11. The same control as the control performed on the mirror actuator 42 described with reference to FIGS. 5 to 10 is also applicable to the configuration of the laser annealing apparatus 11B shown in FIG. 18. In this case, when the control described above is applied, the mirror angles θ1 and θ2 may be replaced with mirror positions y1 and y2, which are the Y-direction positions of the high-reflection mirror 40 shown in FIG. 18, respectively.

4. Second Embodiment

4.1 Configuration

Figure 21:
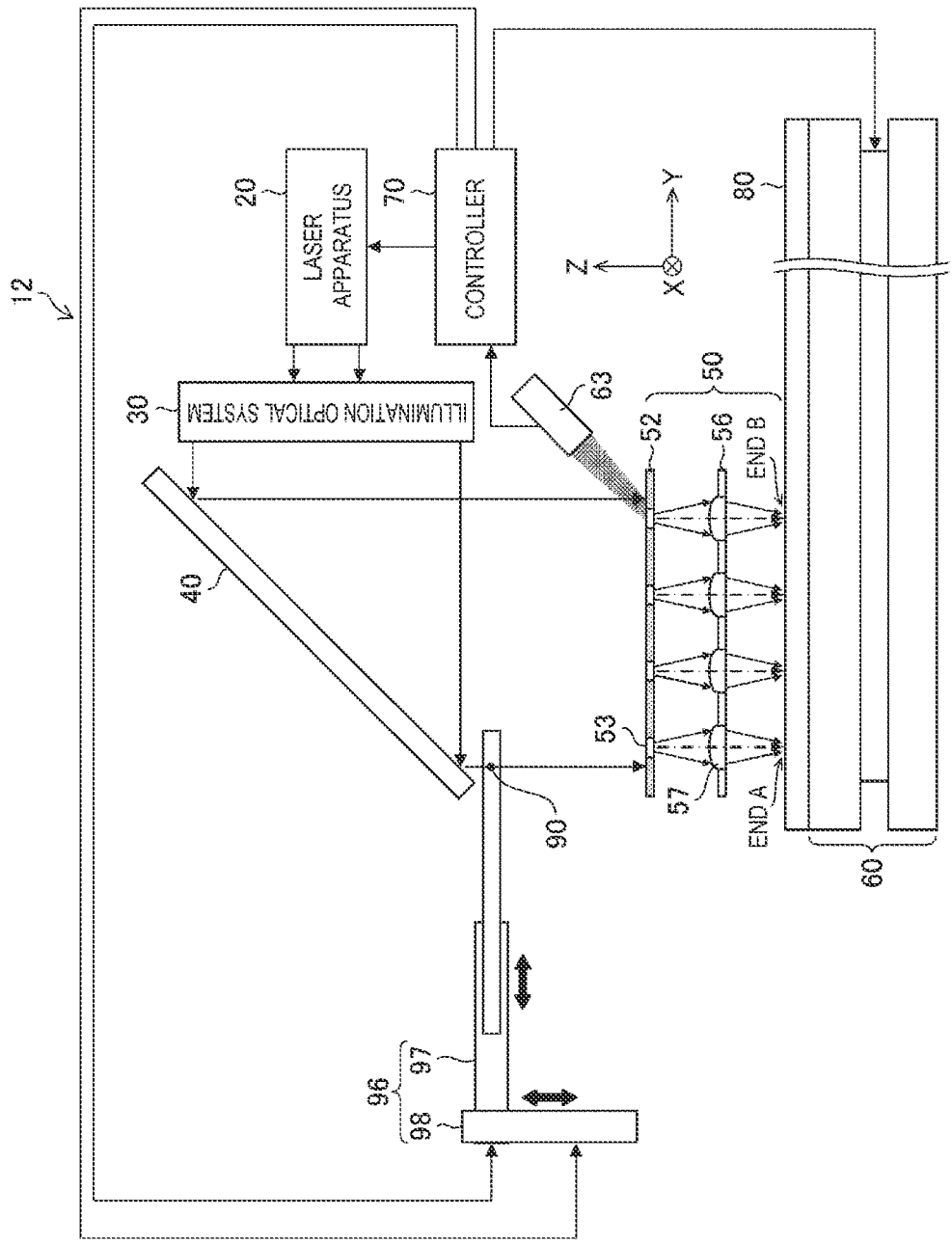
FIG. 21 schematically shows the configuration of a laser annealing apparatus according to a second embodiment.
Figure 22:
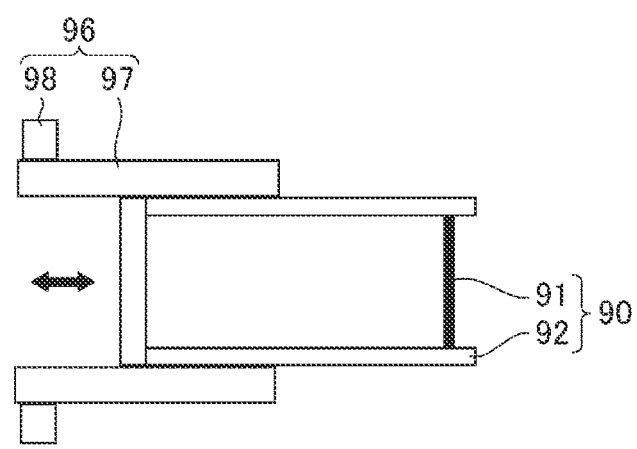
FIG. 22 is a plan view showing an example of the configurations of a wire filter and a filter actuator.

FIG. 21 schematically shows the configuration of a laser annealing apparatus 12 according to a second embodiment. Differences in configuration between FIGS. 21 and 11 will be described. The laser annealing apparatus 12 shown in FIG. 21 includes a wire filter 90 and a filter actuator 96 in place of the mirror actuator 42 in FIG. 11. FIG. 22 is a plan view showing an example of the configurations of the wire filter 90 and the filter actuator 96.

The wire filter 90 is so configured that one or more wires 91 are disposed along the direction X in the optical path on the upstream of the mask 52. In the wire filter 90 shown in the present embodiment, one wire 91 is supported by a filter frame 92 by way of example for ease of illustration. The wire filter 90 blocks part of the pulsed laser light incident on the mask 52.

The wire 91 may be formed of a metal wire or a fiber. The wire 91 is desirably made of a material that does not rust and is formed, for example, of a stainless-steel wire.

The filter actuator 96 is intended to move the wire filter 90. The filter actuator 96 includes a filter actuator 97 for movement in the direction Y and a filter actuator 98 for movement in the direction Z. The filter actuator 97 moves the wire filter 90 in the direction Y, and the filter actuator 98 moves the wire filter 90 in the direction Z.

The wire filter 90 is supported by the filter actuator 97 and is disposed in the optical path on the upstream of the mask 52, for example, in the optical path between the high-reflection mirror 40 and the mask 52.

The filter actuators 97 and 98 may each, for example, be a linear motion stage driven by a linear motor, a stepper motor, or a piezoelectric actuator and may further include a linear guide, a ball screw, and other components. The filter actuators 97 and 98 are each connected to the controller 70.

Figure 23:
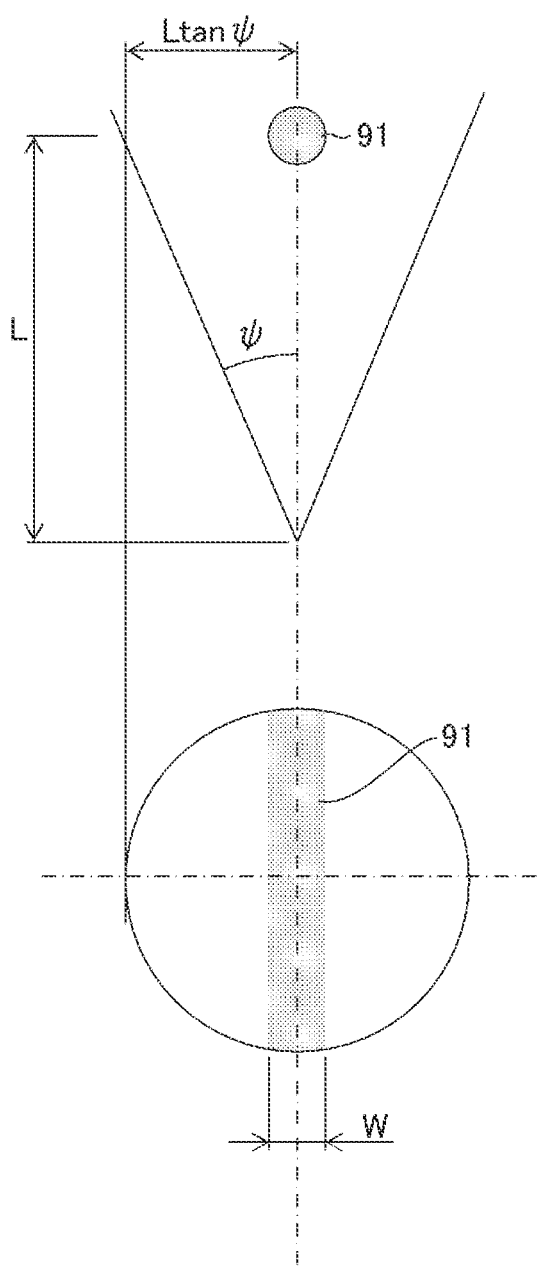
FIG. 23 describes the relationship between the wire diameter of the wire filter and a light blockage ratio.

FIG. 23 is a descriptive diagram for deriving the relationship between the wire diameter of the wire filter and a light blockage ratio. The meanings of the symbols shown in FIG. 23 are listed below.

ψ: Angle of view of each microlens
L: Distance between microlenses and wire
W: Wire diameter A light blockage ratio $R_w$, which represents how much the wire blocks the image produced by the microlens array 56 in the equal transfer, can be derived from the following equation. The following equation shows that the light blockage ratio $R_w$ of the wire can be adjusted by changing the distance L between the microlenses and the wire. The magnitude of the energy density can therefore be adjusted by adjusting the position of the wire filter 90 in the direction Z.

$$R_w = 2WL \tan \psi / \pi (L \tan \psi)^2 = 2W/(\pi L \tan \psi)$$

4.2 Operation

The controller 70 measures the energy density distribution at the mask surface with the energy density measuring device 63 (see FIG. 21) before the workpiece processing and adjusts the position of the wire filter 90 in the directions Z and Y in such a way that the energy densities at the right end (end B) and the left end (end A) of the areas where the illumination light with which the mask 52 is illuminated is used roughly coincide with each other. Adjustment of the position in the direction Z can be used to adjust the magnitude of energy density, and adjustment of the position in the direction Y can be used to adjust the position in the illumination light to reduce the energy density.

The controller 70 may adjust the position of the wire filter 90 while measuring the energy density with the energy density measuring device 63 during the workpiece processing, or the controller 70 may store the relationship of the positions in the directions Z and Y of the wire filter 90 with changes in the energy density in advance and move the wire filter 90 to a computationally optimum position after the energy density is measured.

Figure 24:
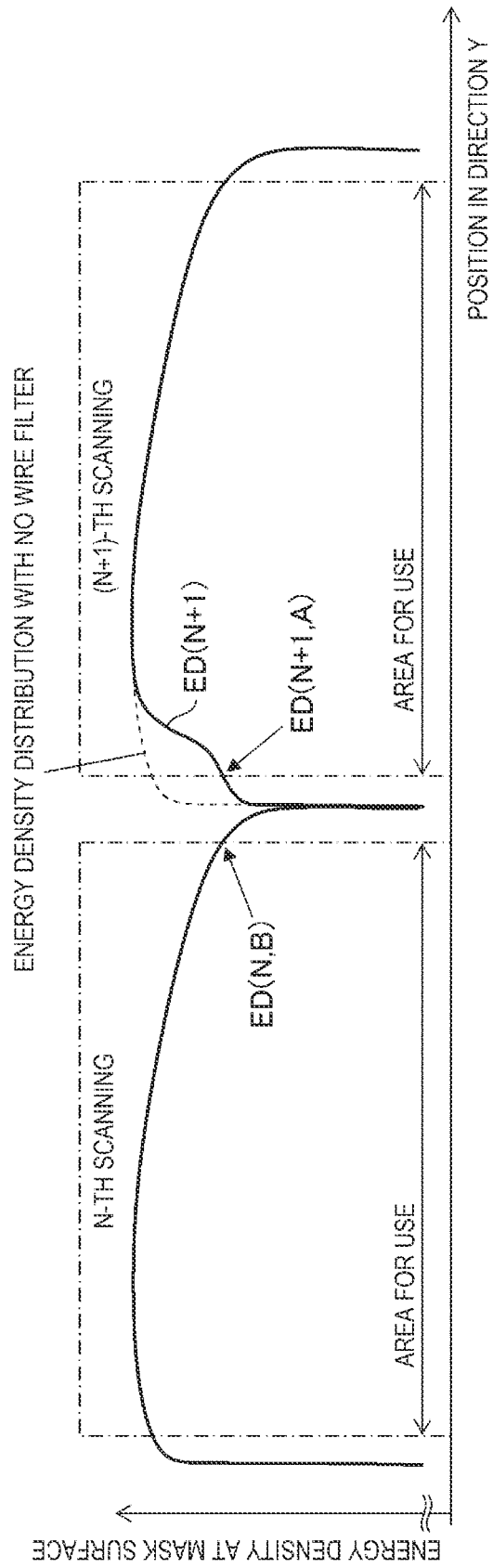
FIG. 24 is a graph showing an example of the energy density distribution of the pulsed laser light at the mask surface achieved by the operation in the second embodiment.

FIG. 24 is a graph showing an example of the energy density distribution of the pulsed laser light at the mask surface achieved by the operation in the second embodiment. FIG. 24 shows an example of the energy density at the mask surface in a case where the wire filter 90 is so controlled that the energy density ED (N, B) at the end B in the N-th scanning is roughly equal to the energy density ED (N+1, A) at the end A in the (N+1)-th scanning The graph drawn with the broken line in the (N+1)-th scanning in FIG. 24 represents the energy density distribution at the mask surface in a case where the wire filter 90 is not used. Using the wire filter 90 in the (N+1)-th scanning achieves an energy density distribution ED (N+1) shown by the solid line in FIG. 24. The "area for use" shown in FIG. 24 is the area where the mask pattern of the mask 52 is present in the range illuminated with the illumination light and is an effective area for use used for the illumination of the mask 52.

In the second embodiment shown in FIGS. 21 to 24, the wire filter 90 is placed only on the side facing the end A (left side in FIG. 21). To smoothly connect the energy density distribution at the end A to the energy density distribution at the end B adjacent to the end A, wire filters may be placed both on the sides facing the end B (right side) and the end A (left side).

In FIG. 21, the energy density is measured at the position of the mask surface, and the energy density may instead be measured at the position of the workpiece surface. That is, instead of or in addition to the energy density measuring device 63, the energy density measuring device 62 shown in FIG. 4 may measure the energy density distribution at the workpiece surface.

In the second embodiment, the position of the wire is adjusted before processing the workpiece. Instead, the position of the wire may be adjusted during the workpiece processing to suppress variation in the energy density distribution during the workpiece processing.

4.3 Effects and Advantages

The laser annealing apparatus 12 according to the second embodiment provides the same effects as those provided by the first embodiment and the first and second variations thereof.

The filter actuators 97 and 98 in the second embodiment are examples of the "actuator that adjusts a position of the filter" in the present disclosure.

4.4 First Variation

4.4.1 Configuration

Figure 25:
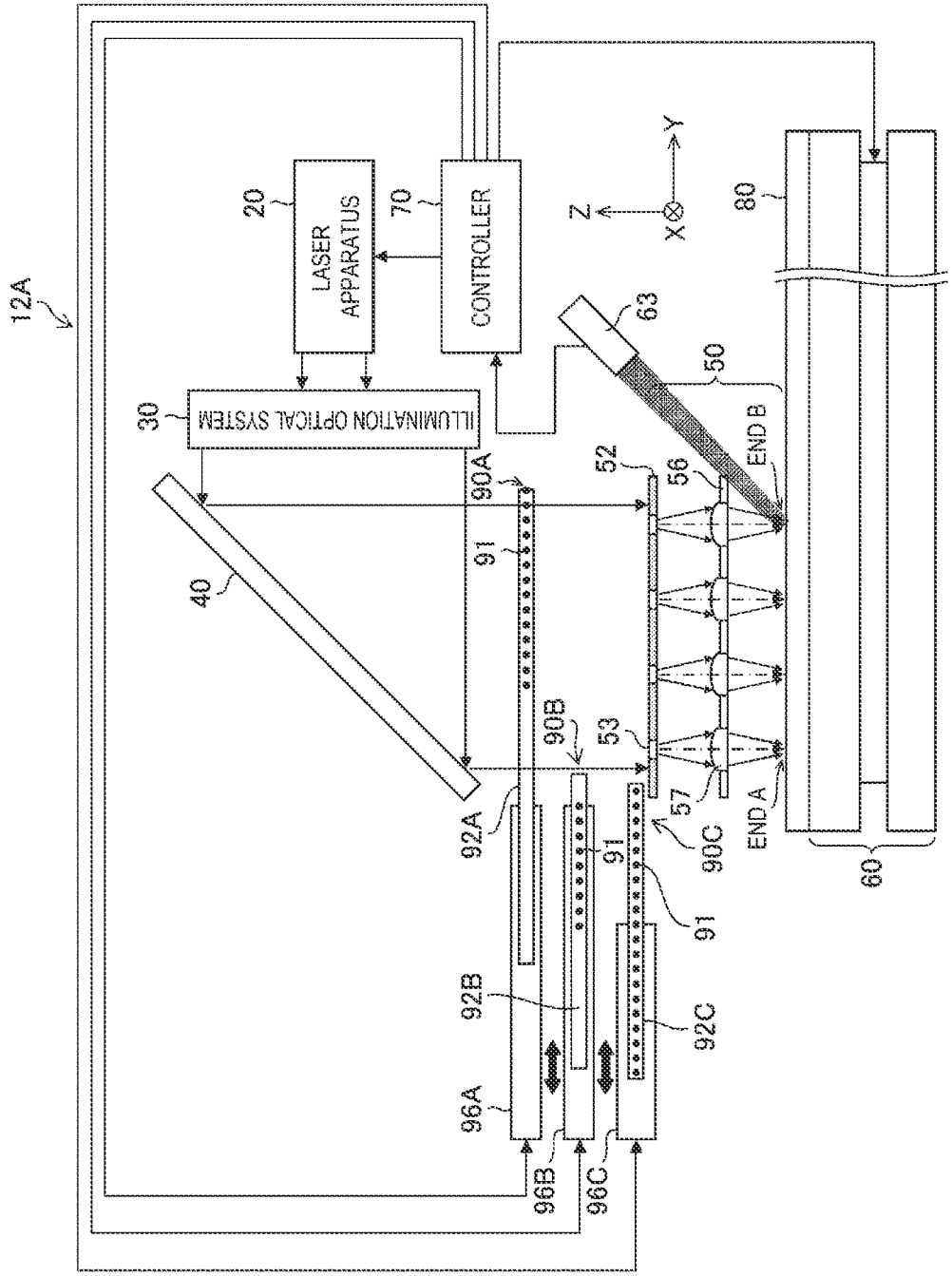
FIG. 25 schematically shows the configuration of a laser annealing apparatus according to a first variation of the second embodiment.

FIG. 25 schematically shows the configuration of a laser annealing apparatus 12A according to a first variation of the second embodiment. Differences in configuration between FIGS. 25 and 21 will be described.

The laser annealing apparatus 12A shown in FIG. 25 includes a first wire filter 90A, a second wire filter 90B, and a third wire filter 90C, a first filter actuator 96A, a second filter actuator 96B, and a third filter actuator 96C in place of the wire filter 90 and the filter actuator 96 shown in FIG. 21.

The first wire filter 90A, the second wire filter 90B, and the third wire filter 90C may each be configured to isolate a central portion of the mask 52 and the end B. For example, the first wire filter 90A is a wire filter that covers at least the end B, as shown in FIG. 25. The first wire filter 90A may instead cover the central portion of the mask 52 in addition to the end B. The second wire filter 90B is a wire filter that covers at least the central portion of the mask 52. The third wire filter 90C is a wire filter that covers at least the end A of the mask 52. The third wire filter 90C may instead cover the central portion of the mask 52 in addition to the end A.

The first wire filter 90A is supported by a first filter frame 92A with a plurality of wires 91 arranged in parallel to the direction X. The first wire filter 90A is supported by the first filter actuator 96A.

Similarly, the second wire filter 90B and the third wire filter 90C are supported by a second filter frame 92B and a third filter frame 92C, respectively, with the plurality of wires 91 arranged in parallel to the direction X. The second wire filter 90B is supported by the second filter actuator 96B, and the third wire filter 90C is supported by the third filter actuator 96C.

The first filter actuator 96A is a filter actuator that moves the first wire filter 90A in the direction Y. Similarly, the second filter actuator 96B is a filter actuator that moves the second wire filter 90B in the direction Y, and the third filter actuator 96C is a filter actuator that moves the third wire filter 90C in the direction Y.

The first filter actuator 96A, the second filter actuator 96B, and the third filter actuator 96C may each be a linear motion stage driven, for example, by a linear motor, a stepper motor, or a piezoelectric actuator and may each include a linear guide, a ball screw, and other components.

The first filter actuator 96A, the second filter actuator 96B, and the third filter actuator 96C are each connected to the controller 70 as shown in FIG. 25.

The controller 70 controls the energy of the laser light outputted from the laser apparatus 20 in conjunction with the control of the first filter actuator 96A, the second filter actuator 96B, and the third filter actuator 96C.

Figure 26:
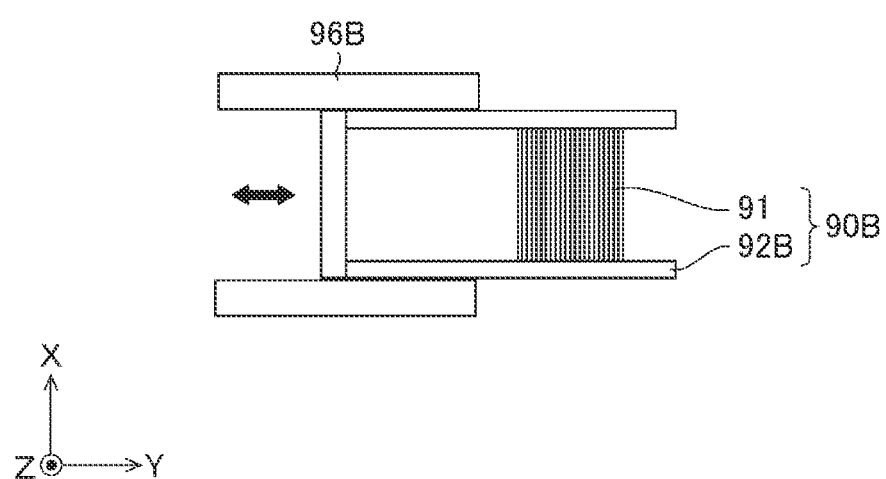
FIG. 26 is a plan view showing an example of the configuration of a second wire filter and a second filter actuator that are part of a plurality of wire filters shown in FIG. 25.

FIG. 26 is a plan view showing an example of the configuration of the second wire filter 90B and the second filter actuator 96B, which are part of the plurality of wire filters shown in FIG. 25. The plurality of wires 91 are arranged in parallel to one another along the direction X, as shown in FIG. 26.

4.4.2 Operation

When the energy density at the end A needs to be increased, the controller 70 transmits an instruction to increase the energy of the outputted laser light to the laser apparatus 20. The first filter actuator 96A is then controlled to insert the first wire filter 90A, which isolates the central portion of the mask 52 and the end B from each other, into the optical path.

In addition to controlling the first filter actuator 96A, the controller 70 controls at least one of the second filter actuator 96B and the third filter actuator 96C as required to insert at least one of the second wire filter 90B and the third wire filter 90C into the optical path.

4.4.3 Effects and Advantages

The first variation improves the flexibility of the control of the energy density at the end A.

4.5 Second Variation

4.5.1 Configuration

Figure 27:
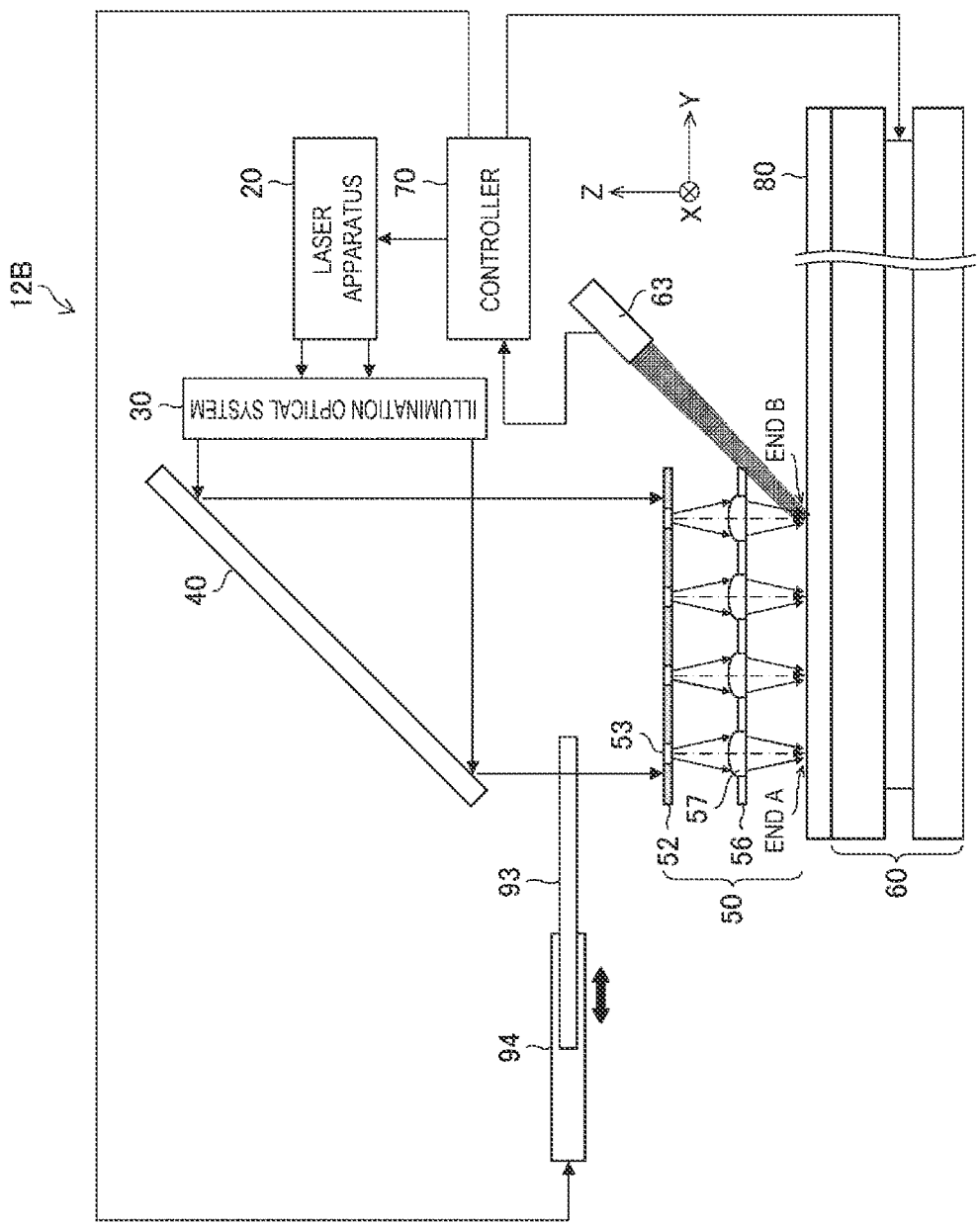
FIG. 27 schematically shows the configuration of a laser annealing apparatus according to a second variation of the second embodiment.

FIG. 27 schematically shows the configuration of a laser annealing apparatus 12B according to a second variation of the second embodiment. Differences in configuration between FIGS. 27 and 21 will be described. The laser annealing apparatus 12B in FIG. 27 includes a gradation filter 93 in place of the wire filter 90.

Figure 28:
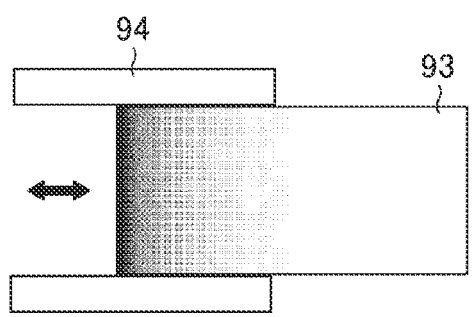
FIG. 28 is a plan view showing an example of a gradation filter.

FIG. 28 is a plan view showing an example of the gradation filter 93. The gradation filter 93 is so configured, for example, that part of a transparent substrate is coated with a material that is opaque or partially transparent to the pulsed laser light. That is, the gradation filter 93 is formed of a base that is transparent to the wavelength of laser light and coated with a material that is opaque or partially transparent to the wavelength of the laser light so that a continuous transmittance distribution is achieved. The gradation filter 93 may instead be made of a material having predetermined transmittance per unit length for the wavelength of the laser light, and the thickness of the gradation filter 93 may continuously vary from location to location.

4.5.2 Operation

The operation of the laser annealing apparatus 12B is the same as that of the laser annealing apparatus 12 in FIG. 21.

4.5.3 Effects and Advantages

According to the form shown in FIGS. 27 and 28, when the energy densities at an end of the illumination light are adjusted, the energy density difference between the radiation areas around the end can be reduced.

4.6 Third Variation

4.6.1 Configuration

Figure 29:
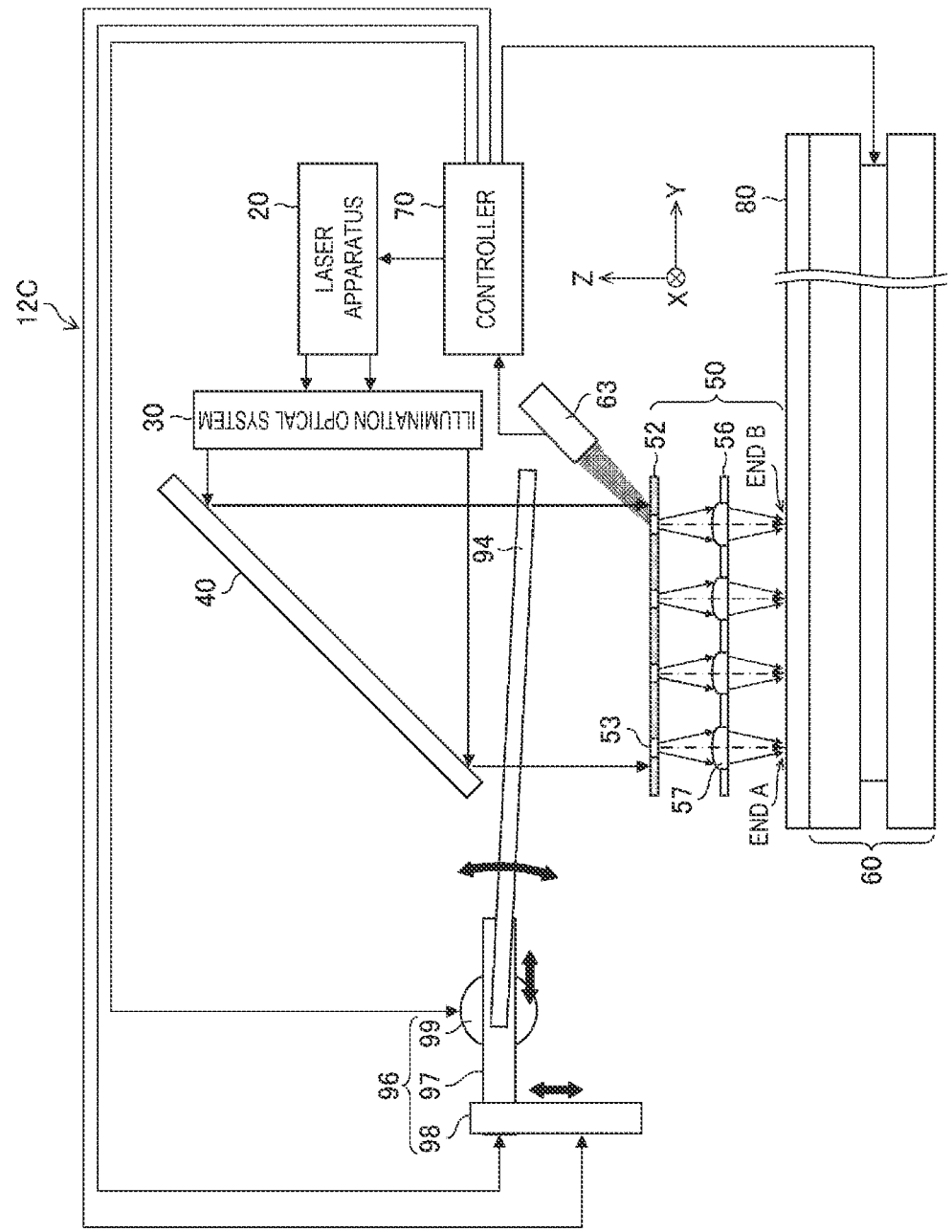
FIG. 29 schematically shows the configuration of a laser annealing apparatus according to a third variation of the second embodiment.
Figure 30:
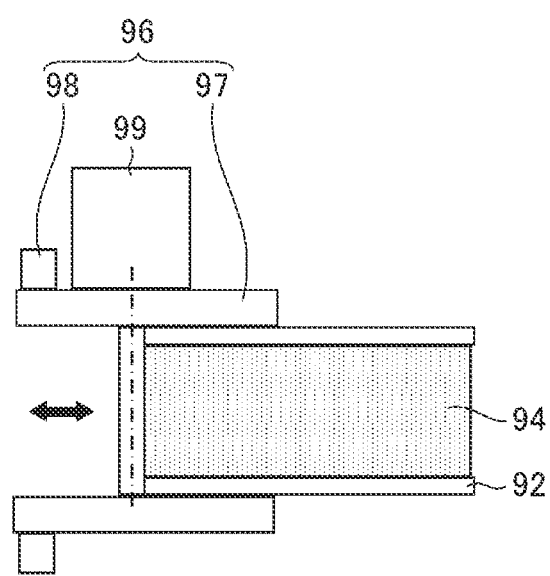
FIG. 30 is a plan view showing an example of a dichroic filter.

FIG. 29 schematically shows the configuration of a laser annealing apparatus 12C according to a third variation of the second embodiment. Differences in configuration between FIGS. 29 and 21 will be described. The laser annealing apparatus 12C in FIG. 29 includes a dichroic filter 94 in place of the wire filter 90. FIG. 30 is a plan view showing an example of the dichroic filter 94.

The dichroic filter 94 is an optical element coated with a dichroic film. The dichroic filter 94 is disposed in the optical path of the pulsed laser light collimated by the illumination optical system 30. The dichroic filter 94 is so characterized that the transmittance thereof varies depending on the angle of incidence of the laser light incident thereon.

The filter actuator 96 includes a rotation mechanism 99 that is capable of adjusting the angle of the dichroic filter 94 with respect to the laser optical path. The rotation mechanism 99 has an axis of rotation parallel to the axis X. The rotation mechanism 99 is connected to the controller 70.

The filter actuator 96 includes the filter actuator 97 for movement in the direction Y and the filter actuator 98 for movement in the direction Z that are capable of adjusting the position of the dichroic filter 94 with respect to the laser optical path. The filter actuator 97 for movement in the direction Y and the filter actuator 98 for movement in the direction Z each include a linear motion stage.

The filter actuator 96 is an example of the "actuator" that adjusts the position and angle of the filter in the present disclosure.

4.6.2 Operation

The controller 70 is capable of controlling the rotation mechanism 99 to adjust the tilt angle of the dichroic filter 94. Tilting the dichroic filter 94 from the horizontal plane allows a change in the angle of incidence of the pulsed laser light incident on the dichroic filter 94, whereby the amount of entire laser light passing through the dichroic filter 94 can be changed.

Figure 31:
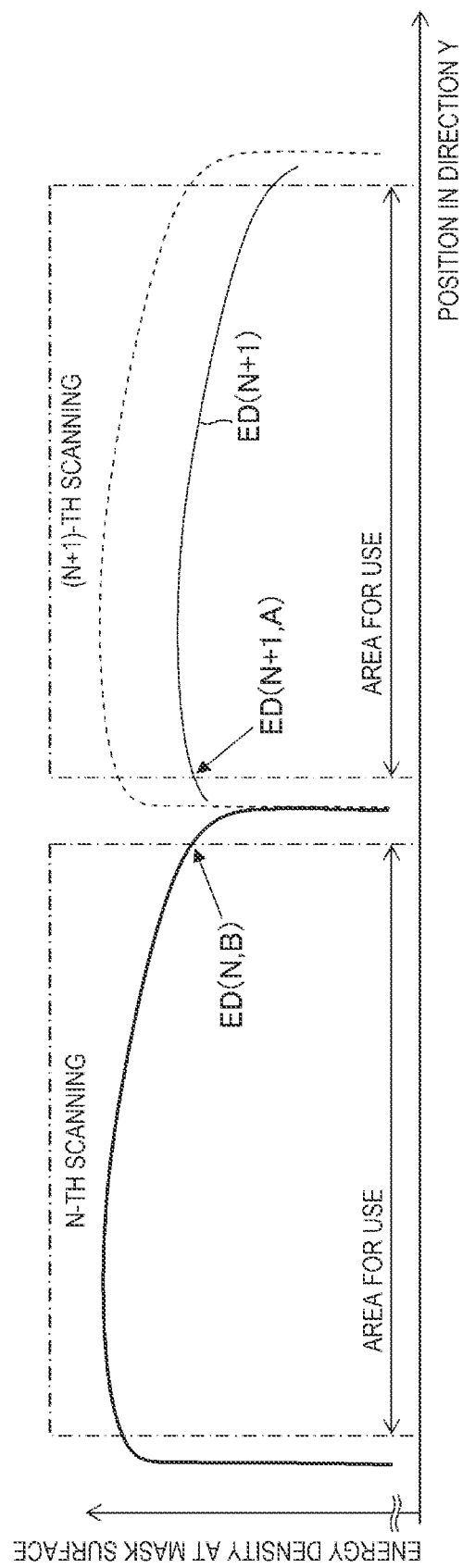
FIG. 31 is a graph showing an example of the energy density distribution of illumination light at the mask surface in the N-th and (N+1)-th scanning achieved by the operation of the laser annealing apparatus according the third variation of the second embodiment.

FIG. 31 is a graph showing an example of the energy density distribution of the illumination light at the mask surface in the N-th and (N+1)-th scanning achieved by the operation of the laser annealing apparatus 12C according to the third variation of the second embodiment. In FIG. 31, the graph drawn with the broken line in the (N+1)-th scanning represents the energy density distribution before the tilt of the dichroic filter 94 is adjusted.

The controller 70 adjusts the illumination light transmittance characteristics by tilting the dichroic filter 94 in the (N+1)-th scanning, as shown in FIG. 31. That is, the dichroic filter 94 is tilted to adjust the energy density ED (N+1) in the (N+1)-th scanning in such a way that the energy density ED (N+1, A) at the end A in the (N+1)-th scanning is roughly equal to the energy density ED (N, B) at the end B in the N-th scanning.

The controller 70 may also expand the angular adjustment range of the rotation mechanism 99 by driving the filter actuator 98, which includes a linear motion stage that moves in the direction Z.

4.6.3 Effects and Advantages

When adjusting the energy density at the end A, the laser annealing apparatus 12C according to the present variation can reduce the energy density difference between the radiation areas around the end.

4.6.4 Others

Figure 32:
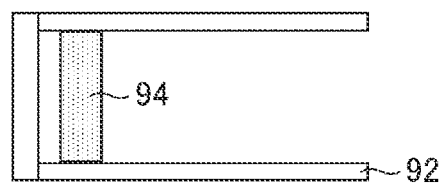
FIG. 32 is a plan view showing another form of the dichroic filter that can be used in the laser annealing apparatus.

FIG. 32 is a plan view showing another form of the dichroic filter 94 that can be used in the laser annealing apparatus 12C. In place of the dichroic filter 94 described with reference to FIGS. 29 and 30, the dichroic filter 94 may cover only part of the optical path, as shown in FIG. 32. Instead, part of a base that transmits the laser light may be coated with a dichroic film.

Controlling the linear motion stage in each of the directions Y and Z provides the same effects as those provided by the second embodiment.

4.7 Fourth Variation

4.7.1 Configuration

Figure 33:
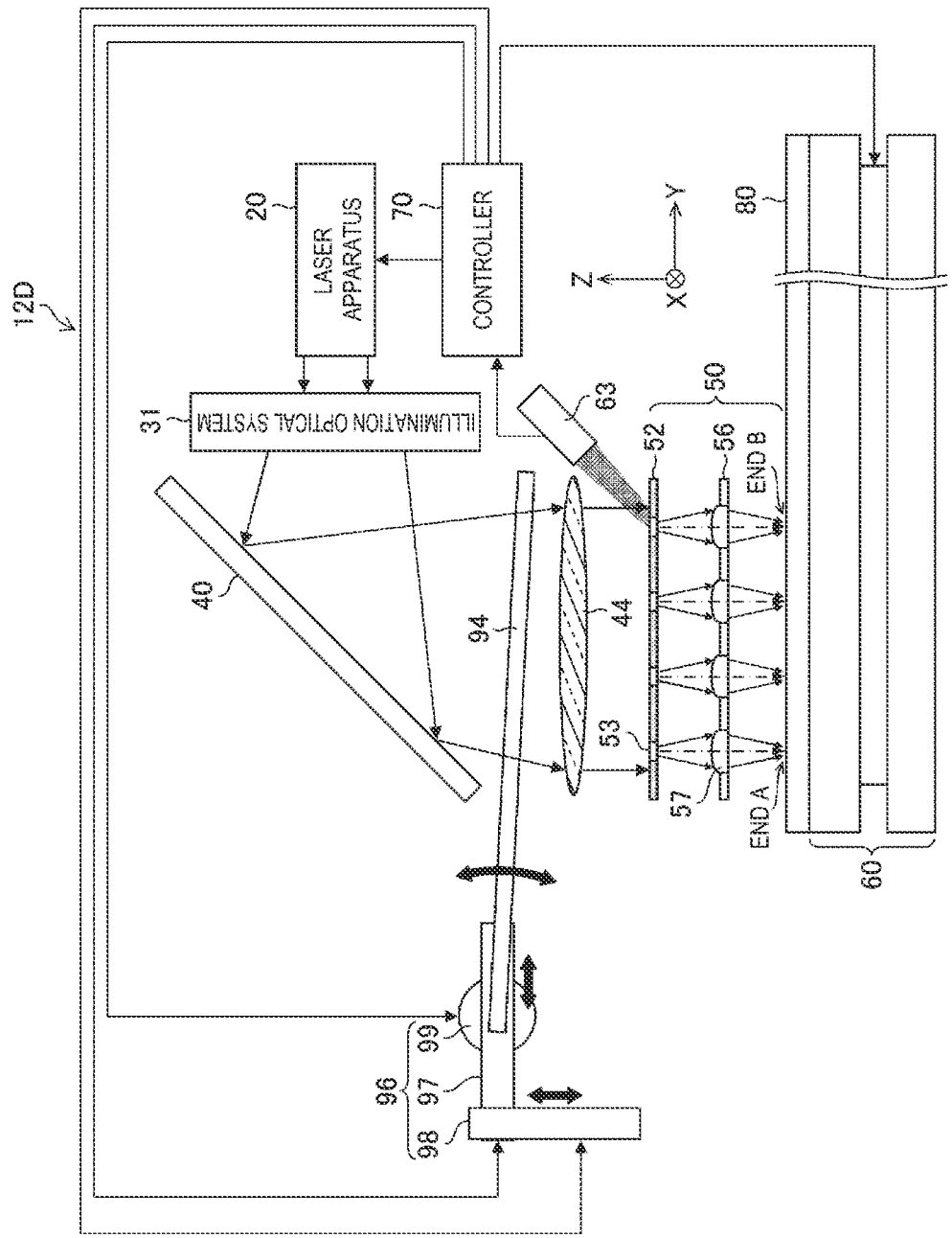
FIG. 33 schematically shows the configuration of a laser annealing apparatus according to a fourth variation of the second embodiment.

FIG. 33 schematically shows the configuration of a laser annealing apparatus 12D according to a fourth variation of the second embodiment. Differences in configuration between FIGS. 33 and 29 will be described. The laser annealing apparatus 12D in FIG. 33 causes the pulsed laser light incident on the dichroic filter 94 to be divergent or convergent. That is, the laser annealing apparatus 12D includes an illumination optical system 31, out of which divergent or convergent light exits, in place of the illumination optical system 30 in FIG. 29 and further includes a collimator optical system 44 on the downstream of the dichroic filter 94. FIG. 33 shows an example of the illumination optical system 31 out of which divergent light exits.

Since the dichroic filter 94 is characterized in that the transmittance thereof changes depending on the angle of incidence of the laser light incident thereon, divergent or convergent light to be incident on the dichroic filter 94 is incident thereon at an angle of incidence that varies depending on the incident position, so that the transmittance of the dichroic filter 94 varies.

The collimator optical system 44 is an optical system that collimates the incident divergent or convergent light. The collimator optical system 44 may, for example, be a collimator lens.

4.7.2 Operation

Figure 34:
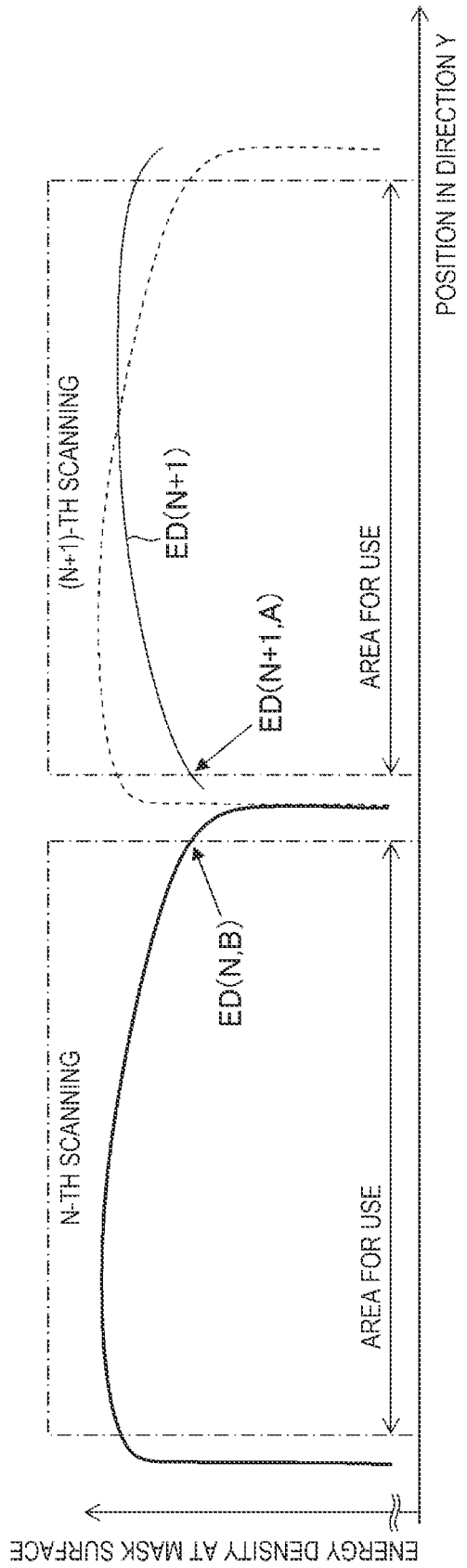
FIG. 34 is a graph showing an example of the energy density distribution of the illumination light at the mask surface in the N-th and (N+1)-th scanning achieved by the operation of the laser annealing apparatus according the fourth variation of the second embodiment.

When the dichroic filter 94 is tilted by the rotation mechanism 99, the angle of incidence of the divergent or convergent light changes depending on the position where light is incident on the dichroic filter 94. The Y-direction energy density distribution of the pulsed laser light having passed through the dichroic filter 94 therefore changes. Using this mechanism, the controller 70 controls the tilt of the dichroic filter 94 in such a way that the energy density at the end B in the N-th scanning and the energy density at the end A in the (N+1)-th scanning are roughly equal to each other, as shown in FIG. 34, to adjust the energy densities at the opposite ends. Furthermore, the controller 70 may drive the Z-direction linear motion stage that forms the filter actuator 98 to change the amount of entire laser light passing through the dichroic filter 94. In FIG. 34, the graph drawn with the broken line in the (N+1)-th scanning represents the energy density distribution before the tilt of the dichroic filter 94 is adjusted.

4.7.3 Effects and Advantages

According to the fourth variation, the flexibility of the adjustment of the energy density can be increased. For example, the energy density at the end B can be increased while the energy density at the end A is lowered.

Figure 35:
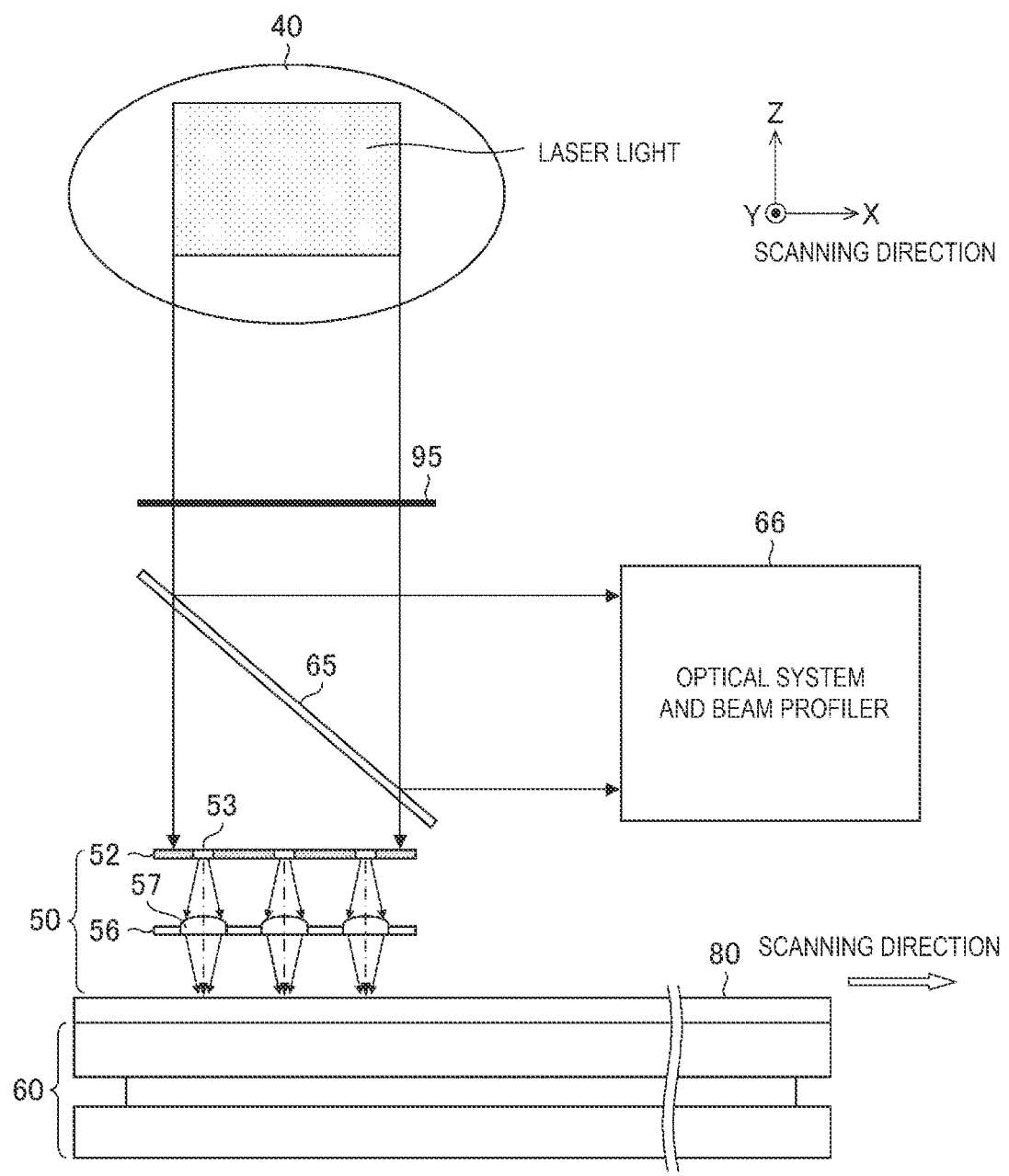
FIG. 35 schematically shows an example of another form for measuring the energy density.

5. Examples of Other Forms for Measuring Energy Density of Pulsed Laser Light FIG. 35 is a key part configuration diagram schematically showing an example of another form for measuring the energy density of pulsed laser light. The configuration shown in FIG. 35 may be employed as an energy density measurement section in place of the energy density measuring device 63 described with reference to FIGS. 11 and 13 and other figures. The configuration shown in FIG. 35 will be described in terms of differences from the laser annealing apparatus 11A in FIG. 11.

The energy density measurement section shown in FIG. 35 includes a beam splitter 65 disposed on the upstream of the mask 52 and an energy density measuring device 66 so disposed that light reflected off the beam splitter 65 is incident on the energy density measuring device 66. The beam splitter 65 is disposed in the optical path between the high-reflection mirror 40 and the mask 52. The energy density measuring device 66 includes a combination of a beam profiler and an optical system that is not shown but forms the same image of the mask 52 from the light reflected off the beam splitter 65.

Part of the laser light traveling from the high-reflection mirror 40 to the mask 52 is reflected off the beam splitter 65, and the distribution of the energy density is measured with the beam profiler via the optical system configured to form the same image of the mask 52. A shutter that is not shown may be disposed to protect the beam profiler.

A light distribution adjuster 95, such as a wire filter, a gradation filter, or a dichroic filter, may be disposed in the optical path between the high-reflection mirror 40 and the beam splitter 65.

The configuration shown in FIG. 35 can be employed as an alternative to the energy density measuring device 62 in FIG. 5. The configuration shown in FIG. 35 can also be employed as an alternative to the energy density measuring device 63 in FIGS. 18, 21, 25, 27, 29, and 33.

6. Arrangement of Plurality of Radiation Areas in Batch Radiation Area

FIG. 3 shows, as an example of the batch radiation area 84, the batch radiation area 84 having a radiation area arrangement pattern via which the 3×7 annealing target areas 82 on the substrate 80 are collectively irradiated. In general, however, the batch radiation area has a radiation area arrangement pattern via which m1×m2 processing receiving areas are collectively irradiated. The parameter m1 is a positive integer greater than or equal to one, and m2 is an integer greater than m1. That is, the batch radiation area is formed of an array of m1×m2 radiation areas in which m1 radiation area rows are arranged in the direction X and m2 radiation areas are arranged along the direction Y in each of the m1 radiation area rows.

The controller 70 controls the energy density adjusting apparatus, such as the mirror actuator 42 and the wire filter 90, in such a way that the energy density at one radiation area in the position corresponding to the end A out of the m2 radiation areas arranged along the direction Y in the (N+1)-th scan area approaches the energy density at one radiation area in the position corresponding to the end B out of the m2 radiation areas arranged along the direction Y in the N-th scan area.

7. Method for Manufacturing Electronic Device

Any of the laser annealing apparatuses 11, 11A, 11B, 12, 12A, 12B, 12C, and 12D described as the first and second embodiments and variations thereof described above can be used to anneal the annealing target areas 82 of the substrate 80 to manufacture electronic devices including semiconductor devices represented by TFTs.

8. Others

The technical items described in the embodiments and the variations described above may be combined with each other as appropriate to the extent that the combination is allowed.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser annealing apparatus comprising:
a laser apparatus configured to output laser light;
an optical system configured to cause the laser light to be radiated in a form of batch radiation to a plurality of processing receiving areas arranged, out of a first direction and a second direction perpendicular to the first direction in a plane of a workpiece, along at least the second direction;
a relative movement apparatus configured to move the workpiece and a batch radiation area relative to each other in the first direction and the second direction, the batch radiation area having an array of a plurality of radiation areas via which the laser light is radiated and which correspond to an array of the plurality of processing receiving areas on which the batch radiation is performed;
a controller configured to control the laser apparatus and the relative movement apparatus in such a way that the batch radiation area and the workpiece are moved relative to each other, which is called scanning, in the first direction in an N-th scan area of the workpiece in N-th scanning, where N is an integer greater than or equal to one, so that the processing receiving areas arranged in a grid along the first and second directions in the N-th scan area are each irradiated with the laser light, after the N-th scanning, the batch radiation area and the workpiece are moved relative to each other in the second direction so that an area to undergo the scanning is changed to an (N+1)-th scan area, and the scanning is performed during (N+1)-th scanning on the (N+1)-th scan area of the workpiece, which is adjacent to and does not overlap with the N-th scan area;
an energy density measuring apparatus configured to measure an energy density at, out of a first end and a second end that are opposite ends of the batch radiation area in the second direction, at least the second end; and
an energy density adjusting apparatus configured to adjust the energy density at least at the first end out of the first end and the second end of the batch radiation area,
the controller being configured to control the energy density adjusting apparatus based on a result of the measurement made by the energy density measuring apparatus to adjust the energy density at the first end when the (N+1)-th scanning is performed in such a way that the energy density at the first end in the (N+1)-th scan area adjacent to the second end in the N-th scan area approaches the energy density at the second end in the N-th scan area.

2. The laser annealing apparatus according to claim 1, wherein the controller is configured to cause, before starting processing the workpiece, the energy density measuring apparatus to measure the energy density at each of the first end and the second end while changing an amount of adjustment made by the energy density adjusting apparatus to acquire relationship information representing a relationship between the amount of adjustment made by the energy density adjusting apparatus and the energy density at each of the first end and the second end, and the controller is configured to, during the processing of the workpiece, control the energy density adjusting apparatus based on the relationship information to adjust the energy density at the first end in the (N+1)-th scanning.

3. The laser annealing apparatus according to claim 1, wherein the measurement of the energy density is made by the energy density measuring apparatus during the N-th scanning being performed, and the controller is configured to adjust the energy density at the first end in the (N+1)-th scanning based on a result of the measurement of the energy density at the second end measured during the N-th scanning being performed.

4. The laser annealing apparatus according to claim 1, wherein the batch radiation area has an array of the radiation areas formed of m1×m2 radiation areas in which m1 radiation area rows are arranged in the first direction and m2 radiation areas are arranged along the second direction in each of the m1 radiation area rows, where m1 is an integer greater than or equal to one, and m2 is an integer greater than m1, and the controller is configured to control the energy density adjusting apparatus in such a way that the energy density at one of the radiation areas that is located in a position corresponding to the first end out of the m2 radiation areas arranged along the second direction in the (N+1)-th scan area approaches the energy density at one of the radiation areas that is located in a position corresponding to the second end out of the m2 radiation areas arranged along the second direction in the N-th scan area.

5. The laser annealing apparatus according to claim 1, wherein the optical system includes a mask having a mask pattern configured to form the plurality of radiation areas, and a mirror configured to reflect the laser light toward the mask.

6. The laser annealing apparatus according to claim 5, wherein the energy density adjusting apparatus includes a rotation mechanism configured to adjust an angle of reflection at which the laser light is reflected off the mirror.

7. The laser annealing apparatus according to claim 5, wherein the energy density adjusting apparatus includes a mirror moving mechanism configured to adjust a position of the mirror in the second direction.

8. The laser annealing apparatus according to claim 5, wherein the energy density adjusting apparatus includes a filter configured to partially block the laser light to be incident on the mask, and an actuator configured to adjust at least one of a position and an angle of the filter.

9. The laser annealing apparatus according to claim 8, wherein the filter is a wire filter including one or more wires.

10. The laser annealing apparatus according to claim 8, wherein the filter is so configured that part of a transparent substrate is coated with a material that is opaque to the laser light.

11. The laser annealing apparatus according to claim 10, wherein the filter is a gradation filter coated with the opaque material or a material that is partially transparent to the laser light so that a continuous transmittance distribution is achieved.

12. The laser annealing apparatus according to claim 8, wherein the filter is a gradation filter made of a material that has predetermined transmittance per unit length for a wavelength of the laser light and has a thickness that continuously varies depending on a location of the filter.

13. The laser annealing apparatus according to claim 8, wherein the filter includes a substrate coated with a dichroic film having transmittance that varies depending on an angle of incidence of the laser light incident on the dichroic film, and the actuator is configured to adjust an angle of the filter to adjust the angle of incidence of the laser light incident on the filter.

14. The laser annealing apparatus according to claim 5, wherein the energy density measuring apparatus is configured to measure the energy density at a position of the mask.

15. The laser annealing apparatus according to claim 1, wherein the energy density measuring apparatus is configured to measure the energy density at a position of the workpiece.

16. The laser annealing apparatus according to claim 1, wherein the energy density measuring apparatus includes measuring devices separate from each other, a measuring device for a first end configured to measure the energy density at the first end, and a measuring device for a second end configured to measure the energy density at the second end.

17. The laser annealing apparatus according to claim 1, wherein the energy density measuring apparatus includes a beam profiler configured to measure an energy density distribution of the batch radiation including the first and second ends.

18. The laser annealing apparatus according to claim 17, wherein the optical system includes a mask configured to form the plurality of radiation areas corresponding to the array of the plurality of processing receiving areas, a mirror configured to reflect the laser light toward the mask, and a beam splitter disposed in an optical path between the mirror and the mask, and part of the laser light enters the energy density measuring apparatus via the beam splitter.

19. A method for manufacturing an electronic device by using a laser annealing apparatus including, a laser apparatus configured to output laser light, an optical system configured to cause the laser light to be radiated in a form of batch radiation to a plurality of processing receiving areas arranged, out of a first direction and a second direction perpendicular to the first direction in a plane of a workpiece, along at least the second direction, a relative movement apparatus configured to move the workpiece and a batch radiation area relative to each other in the first direction and the second direction, the batch radiation area having an array of a plurality of radiation areas via which the laser light is radiated and which correspond to an array of the plurality of processing receiving areas on which the batch radiation is performed, a controller configured to control the laser apparatus and the relative movement apparatus in such a way that the batch radiation area and the workpiece are moved relative to each other, which is called scanning, in the first direction in an N-th scan area of the workpiece in N-th scanning, where N is an integer greater than or equal to one, so that the processing receiving areas arranged in a grid along the first and second directions in the N-th scan area are each irradiated with the laser light, after the N-th scanning, the batch radiation area and the workpiece are moved relative to each other in the second direction so that an area to undergo the scanning is changed to an (N+1)-th scan area, and the scanning is performed during (N+1)-th scanning on the (N+1)-th scan area of the workpiece, which is adjacent to and does not overlap with the N-th scan area, an energy density measuring apparatus configured to measure an energy density at, out of a first end and a second end that are opposite ends of the batch radiation area in the second direction, at least the second end, and an energy density adjusting apparatus configured to adjust the energy density at least at the first end out of the first end and the second end of the batch radiation area, the controller being configured to control the energy density adjusting apparatus based on a result of the measurement made by the energy density measuring apparatus to adjust the energy density at the first end when the (N+1)-th scanning is performed in such a way that the energy density at the first end in the (N+1)-th scan area adjacent to the second end in the N-th scan area approaches the energy density at the second end in the N-th scan area, the method comprising performing the scanning a plurality of times including the N-th scanning and the (N+1)-th scanning on the workpiece to anneal each of the processing receiving areas of the workpiece.

20. The method for manufacturing an electronic device according to claim 19, wherein the workpiece is a substrate coated with amorphous silicon, and the laser light is pulsed laser light having an ultraviolet wavelength.

* * * * *